(12) United States Patent
Anazawa et al.

(10) Patent No.: US 7,355,334 B2
(45) Date of Patent: Apr. 8, 2008

(54) ELECTRON BEAM GENERATOR DEVICE HAVING CARBON NANOTUBE STRUCTURE WITH A CROSSLINKED NETWORK STRUCTURE

(75) Inventors: Kazunori Anazawa, Kanagawa (JP); Chikara Manabe, Kanagawa (JP); Kentaro Kishi, Kanagawa (JP); Taishi Shigematsu, Kanagawa (JP); Miho Watanabe, Kanagawa (JP); Masaki Hirakata, Kanagawa (JP); Takashi Isozaki, Kanagawa (JP); Hiroyuki Watanabe, Kanagawa (JP); Shigeki Ooma, Kanagawa (JP); Shinsuke Okada, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 365 days.

(21) Appl. No.: 10/933,296

(22) Filed: Sep. 3, 2004

(65) Prior Publication Data

US 2005/0212395 A1  Sep. 29, 2005

(30) Foreign Application Priority Data

Mar. 23, 2004 (JP) ............................. 2004-084946

(51) Int. Cl.
*H01J 1/62* (2006.01)
*H01J 1/00* (2006.01)

(52) U.S. Cl. ...................... 313/495; 313/311
(58) Field of Classification Search ........ 313/309–311, 313/495–497; 423/447.1
See application file for complete search history.

(56) References Cited

U.S. PATENT DOCUMENTS

2004/0072494 A1* 4/2004 Nakamoto ................. 445/24

2006/0246438 A1* 11/2006 McCall et al. ............... 435/6

FOREIGN PATENT DOCUMENTS

JP  A 2002-503204  1/2002

OTHER PUBLICATIONS

De Jonge et al. "High Brightness Electron Beam From a Multi-Walled Carbon Nanotube," Letters to Nature, *Nature*, vol. 420, Nov. 28, 2002.
Lyubchenko et al. "Atomic Force Microscopy of DNA and Bacteriophage in Air, Water and Propanol: The Role of Adhesion Forces," Nucleic Acids Research, 1993, vol. 21, No. 5, pp. 1117-1123.

* cited by examiner

*Primary Examiner*—Joseph Williams
*Assistant Examiner*—Bumsuk Won
(74) *Attorney, Agent, or Firm*—Oliff & Berridge, PLC

(57) ABSTRACT

An electron beam generator device includes a base body having a conductive surface and a electron-emission electrode having a carbon nanotube structure on the conductive surface of the substrate. The carbon nanotube structure constitutes a network structure which has plural carbon nanotubes and a crosslinked part including a chemical bond of plural functional groups. The chemical bond connects one end of one of the carbon nanotubes to another one of the carbon nanotubes.

A method for producing an electron beam generator device, includes applying plural carbon nanotubes each having a functional group onto a conductive surface of a base body, and crosslinking the functional groups with a chemical bond to form a crosslinked part, thereby forming a carbon nanotube structure constituting a network structure having plural carbon nanotubes electrically connected to each other.

9 Claims, 6 Drawing Sheets

REACTION SCHEME OF CARBOXYL GROUP
INTRODUCTION INTO CARBON NANOTUBE

REACTION SCHEME OF METHYL-ESTERIFICATION
OF CARBON NANOTUBE-CARBOXYLIC ACID

REACTION SCHEME OF POLYMERIZATION THROUGH INTERESTERIFICATION OF METHYL CARBON NANOTUBE-CARBOXYLATE WITH GLYCERIN

ELECTRON BEAM GENERATOR DEVICE HAVING CARBON NANOTUBE STRUCTURE WITH A CROSSLINKED NETWORK STRUCTURE

BACKGROUND OF THE INVENTION

1. Field of the Invention

The present invention relates to an electron beam generator device for emitting electron beams, such as electron source of electron microscope (filament of electron gun) and cathode electrode of FED (field-emission display), and to a method for producing it. In particular, the invention relates to such an electron beam generator with carbon nanotubes and to a method for producing it.

2. Description of the Related Art

As having a unique structure and unusual characteristics, carbon nanotubes (CNT) may have various applications. Carbon nanotubes have a cylindrical shape of one-dimensionality formed by coiling up a graphene sheet of carbon hexagons. Those having a structure of one graphene sheet are referred to as single-walled nanotubes (SWNT), and those having a structure of multiple graphene sheets are referred to as multi-walled nanotubes (MWNT). SWNT have a diameter of about 1 nm, and MWNT have a diameter of a few nm or so; and they are extremely thin as compared with conventional carbon fibers.

Carbon nanotubes have a length of an order of micrometers, and are characterized in that the aspect ratio thereof to diameter is extremely large. In addition, carbon nanotubes have a spiral structure of carbon hexagons, and therefore have extremely unusual characteristics in that they have both properties of metal and semiconductor. Moreover, the electroconductivity of carbon nanotubes is extremely high, and they may conduct a current of at least 100 MA/cm$^2$ in terms of the current density through them.

Not only such electric characteristics, carbon nanotubes have many excellent mechanical properties. Specifically, since they are made up of carbon atoms only, they are extremely lightweight but have a Young's modulus of over 1 TPa and are extremely tough. In addition, since they are a cage substance, they have good elasticity and stability. To that effect, carbon nanotubes have various excellent properties and are extremely attractive substances as industrial materials.

Various application studies based on the excellent characteristics of carbon nanotubes have heretofore been made. Carbon nanotubes are added for resin reinforcement or for producing conductive composite materials, and they are used for probes of scanning probe microscopes. In addition, carbon nanotubes are utilized as micro electron sources for field-emission rectifier devices and flat displays, and are being applied to hydrogen storage.

Further, since carbon nanotubes have an extremely large aspect ratio as so mentioned hereinabove, and their edges are sharp, and, in addition, they are chemically stable and mechanically tough. Accordingly, they are promising emitter materials for field-emission technology. Heretofore, many studies for practicability of field-emission electron devices and flat displays with carbon nanotubes have been made.

In the document (Niels de Jonge, Yann Lamy, Loen Schoots & Tjek H. Oosterkamp's "High Brightness Electron Beam from a Multi-walled Carbon Nanotube" in *Nature*, Vol. 420, pp. 393-395, 2002), it is disclosed that a technique of utilizing carbon nanotubes as an electron source of electron microscopes, as a type of microelectron sources.

The electron source (electron gun) of electron microscopes heretofore known in the art includes thermal emission devices with tungsten V-shaped filament or LaB$_6$ chip therein, and field-emission devices with tungsten single-crystal chip therein. In general, the brightness of field-emission devices is high and the energy width thereof is small, and therefore field-emission devices are favorable for the electron source of electron microscopes. The electron source disclosed in the document comprises carbon nanotubes fixed on tungsten chips, and it emits electron beams in a mode of field emission. It is known that the brightness of the electron beams from it, actually measured, is larger by at least 10 times than that from conventional devices.

However, the method of producing the electron source disclosed in the document comprises using a piezomanipulator in a scanning electron microscope to pick up one or a few carbon nanotubes and fixing them to a tungsten chip therein. The method is advantageous in that suitable carbon nanotubes may be selected in any desired manner, but it takes a lot of time and labor for producing the intended product and its productibity is extremely low.

SUMMARY OF THE INVENTION

The present invention has been made in view of the above circumstances and provides an electron beam generator device which may effectively utilize the characteristics of carbon nanotubes and has good productivity and which can realize electron beam emission at high current density and a method for producing such an electron beam generator device having the above-mentioned excellent characteristics in a simplified manner within a shortened period of time.

According to a first aspect of the invention, an electron beam generator device includes a base body having a conductive surface and an electron-emission electrode having a carbon nanotube structure on the conductive surface of the base body. The carbon nanotube structure constitutes a network structure which has plural carbon nanotubes and a crosslinked part including a chemical bond of plural functional groups, the chemical bond at least connecting one end of one of the carbon nanotubes to another one of the carbon nanotubes.

The electron beam generator device of the invention has a carbon nanotube structure that is in a network structure of plural string-like carbon nanotubes connetcting to each other via plural crosslinked parts, and it may stably exhibit the properties intrinsic to carbon nanotubes. Specifically, in the carbon nanotube structure, a large number of ends of individual carbon nanotubes exist and they ensure a large number of electron emission sites and, in addition, they are mutually electrically connected to each other in a good manner, and therefore they may effectively transfer electrons to the emission sites. Moreover, since the structure forms a crosslinked film, its mechanical strength is high and it is highly resistant to heat and external force.

On the other hand, for electron beam generator devices with carbon nanotubes heretofore known in the art, mere carbon nanotubes are filled with a binder resin to form a pack membrane. However, when it is used in electron beam generator devices, then the electric characteristics and the mechanical characteristics of the devices may be unstable depending on the contact condition of the carbon nanotubes with each other, and therefore the devices could not fully exhibit the characteristics of the carbon nanotubes therein.

In the electron beam generator device of the invention where the carbon nanotube structure serves as a micro electron source, the carbon nanotubes are mutually crosslinked with each other and can therefore stably exhibit their electric characteristics. Accordingly, as compared with the pack membrane of carbon nanotubes, the carbon nanotube structure in the device of the invention may greatly improve the electric characteristics and the mechanical characteristics of the device. The device of the invention is applicable to not only electron microscopes but also any other appliances using electron beams such as electron exposure devices.

The carbon nanotube structure in the invention is so constructed that plural carbon nanotubes therein form a network structure via plural crosslinked parts therebetween. Therefore, it differs from other materials where carbon nanotubes are kept in incidental contact with each other and are substantially isolated from each other, such as films of a dispersion of carbon nanotubes alone or films of a dispersion of carbon nanotubes in resin, and it stably exhibits the excellent characteristics of carbon nanotubes therein.

According to a second aspect of the invention, a method for producing an electron beam generator device which has an electron-emission electrode, includes applying plural carbon nanotubes each having a functional group onto a conductive surface of a base body, and crosslinking the functional groups with a chemical bond to form a crosslinked part, thereby forming a carbon nanotube structure constituting a network structure having plural carbon nanotubes electrically connected to each other, in which the electron-emission electrode includes the carbon nanotube structure.

In the applying in the invention, plural carbon nanotubes having functional groups are fed to the conductive surface of a base body. When a solution that contains plural carbon nanotubes having functional groups (crosslinking solution) is used for the supply, then the solution may be applied to the surface of a base body.

In the crosslinking, the supplied plural carbon nanotubes having functional groups are crosslinked (by curing the crosslinking solution) to thereby chemically bond the functional groups to each other so as to form crosslinked parts, and a carbon nanotube structure to constitute a network structure of the plural carbon nanotubes mutually electrically connected to each other is thereby constructed.

Via the applying and the crosslinking, the carbon nanotube structure is formed and stabilized on the surface of the base body.

According to the invention as above, electron beam generator devices that may effectively utilize the characteristics of carbon nanotubes and may realize electron beam emission at high current density can be produced in a simplified manner within a shortened period of time.

BRIEF DESCRIPTION OF THE DRAWINGS

FIG. 4A is a tungsten hairpin filament; FIG. 4B is a point filament; FIG. 4C is an LaB$_6$ filament.

DETAILED DESCRIPTION OF THE PREFFERED EMBODIMENTS

Figure 1:
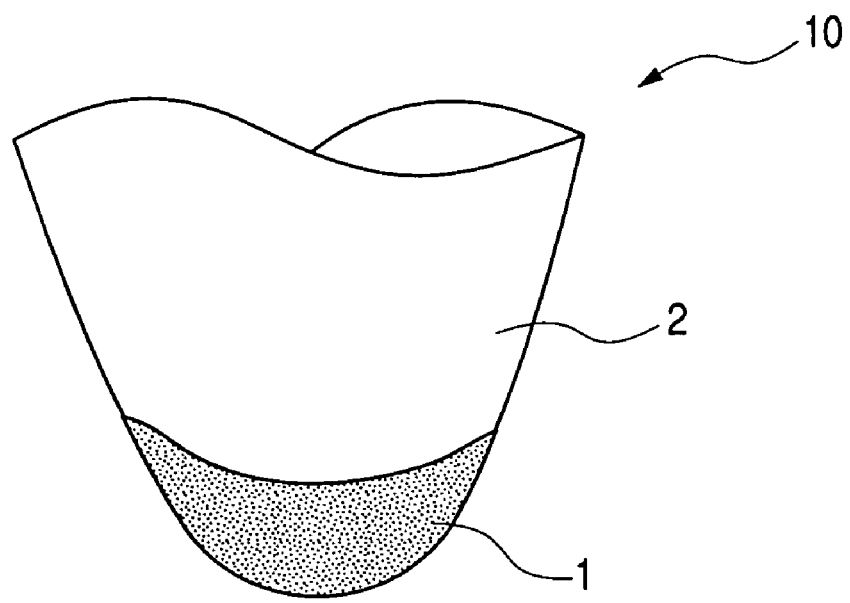
FIG. 1 is an enlarged front view of one preferred embodiment of the electron beam generator device of the invention.

The details of the invention will be described below.

In the present invention, an electron beam generator device includes a base body having a conductive surface and an electron-emission electrode having a carbon nanotube structure on the conductive surface of the base body. The carbon nanotube structure constitutes a network structure which has plural carbon nanotubes and a crosslinked part including a chemical bond of plural functional groups. The chemical bond at least connects one end of one of the carbon nanotubes to another one of the carbon nanotubes.

Preferably, the crosslinked part is formed by curing a solution that contains plural carbon nanotubes each having a functional group, to cause a chemical bonding between the plurality of the functional groups contained in the carbon nanotubes.

A preferred first structure for the crosslinked part is formed by curing a carbon nanotube having a functional group and a crosslinking agent capable of reacting with the functional group, to cause a crosslinking reaction of the functional group contained in the carbon nanotube with the crosslinking agent.

When the carbon nanotube structure layer has the first structure as above, then the crosslinked parts where the plural carbon nanotubes are crosslinked with each other may form a crosslinked structure where the residues remaining after the crosslinking reaction of the functional groups are linked to each other via a linking group of a residue remaining after the crosslinking reaction with the crosslinking agent. Having the first structure, therefore, the electron beam generator device may be a high-efficiency broadband device.

In this case, the crosslinked part preferably has a chemical structure selected from the group consisting of —COO(CH$_2$)$_2$OCO—, —COOCH$_2$CHOHCH$_2$OCO—, —COOCH$_2$CH(OCO—)CH$_2$OH and —COOCH$_2$CH(OCO—)CH$_2$OCO—. In this case, the crosslinking agent is so selected that it causes crosslinking reaction with the selected functional groups.

A preferred second structure for the crosslinked parts is formed through chemical bonding of the plural functional groups to each other to give the crosslinked parts. The reaction to form the chemical bonding is preferably any of a dehydration condensation reaction, a substitution reaction, an addition reaction or an oxidation reaction.

When the carbon nanotube structure layer has the second structure as above, then the functional groups bonding to the carbon nanotubes are bonded to each other with a chemical bonding to form the crosslinked parts, via which the plural carbon nanotubes are connected to each other to form the network structure. Accordingly, in this embodiment, the size of the crosslinked parts where the carbon nanotubes are connected to each other may be kept constant depending on the type of the functional groups to be bonded thereto.

Carbon nanotubes have an extremely stable chemical structure, and there is a low possibility that any other functional groups than the functional groups for modification of carbon nanotubes may bond thereto. When the functional groups are bonded with a chemical bond, then the crosslinked parts may have the planned structure and the carbon nanotube structure thus obtained may be homogeneous.

In addition, since the functional groups are bonded to each other in a mode of chemical bonding in this embodiment, the length of the crosslinked parts between the bonded carbon nanotubes may be shortened as compared with the other case where the functional groups are crosslinked with a crosslinking agent. Accordingly, the carbon nanotube structure obtained may be a tight structure, and it can readily exhibit the effect intrinsic to carbon nanotubes.

The crosslinked parts in this case preferably have at least one chemical structure selected from a group consisting of —COOCO—, —NHCO—, —COO—, —NCH—, —NH—, —S—, —O—, —NHCOO— and —S—S—.

The plural carbon nanotubes in the invention are preferably multi-walled carbon nanotubes (MWNT) of high electroconductivity in point of increasing the electroconductivity of the electron bean generator device to be finally obtained herein. Another advantage of MWNT is that, when functional groups are bonded to them, they hardly break the graphene sheet in the inner layer of the carbon nanotubes, and the characteristics of the carbon nanotubes are hardly worsened.

Preferably, a material of the conductive surface of the base body in the invention is at least any one selected from a group consisting of W, Mo, Ta, $LaB_6$, ZrC, TiC, TaC, HfC, GaN, Si, diamond, and diamond-like carbon. In view of the heat resistance and the work function thereof, preferred are W and $LaB_6$; and more preferred is W since it is inexpensive and has high electroconductivity and good heat resistance.

The carbon nanotube structure may be formed by itself alone; but if desired, aliphatic polyketone polymers that are crosslinked via any other functional group than the functional groups contained in the crosslinked parts may be compounded to the carbon nanotubes in the carbon nanotube structure to thereby form a network structure complex along with the carbon nanotube structure.

Since a complex network structure fomed of the carbon nanotube structure and the aliphatic polyketone polymer is formed on the surface of the base body, the electron beam generator device to be constructed in this embodiment may have excellent characteristics of the two. Concretely, it may have the above-mentioned excellent electric characteristics and efficient electron beam emission characteristics derived from carbon nanotubes, and may additionally have the high mechanical strength and the good heat resistance derived from the aliphatic polyketone polymers which is engineering plastics. Accordingly, this embodiment gives electron beam generator devices of high durability. This embodiment is especially favorable to electron beam generator devices that may be exposed to high heat (e.g., thermal emission-type electron guns).

In the present invention, a method for producing an electron beam generator device, includes a supply step of applying plural carbon nanotubes each having a functional group to a conductive surface of a base body, and a crosslinking step of crosslinking the functional groups with a chemical bond to form a crosslinked part, thereby forming a carbon nanotube structure constituting a network structure having plural carbon nanotubes electrically connected to each other.

In one preferred embodiment of forming the crosslinked part of the functional groups in a mode chemical bonding of the functional groups to each other in the crosslinking step in the method of producing the electron beam generator of the invention, a crosslinking agent is used for crosslinking the plural functional groups. In the first embodiment, a crosslinking agent for crosslinking the functional groups is further added to the surface of the base body.

In the first embodiment, the carbon nanotube structure itself may be stabilized on the surface of the base body.

The crosslinking agent is preferably a non-self-polymerizing crosslinking agent. Regarding its characteristics, if the crosslinking agent has the property of mutual polymerization with each other (self-polymerizability), then the linking groups may contain a polymer of two or more crosslinking agents bonding to each other, and if so, the substantial carbon nanotube density in the carbon nanotube structure may lower and the electron beam generator device produced could not have good electroconductivity and mechanical strength.

In addition, if a self-polymerizing crosslinking agent is used and if the crosslinking agent mutually polymerizes with each other during or before the crosslinking reaction in the crosslinking step, then the bonding of the crosslinking agent molecules may be giantic and prolonged, and if so, the carbon nanotubes bonding to these may be inevitably spaced greatly from each other.

In this case, it is in fact difficult to control the degree of the self-polymerization reaction of the crosslinking agent molecules, and therefore the crosslinked structure of the carbon nanotubes connecting to each other may fluctuate and vary depending on the fluctuation of the polymerized condition of the crosslinking agent molecules.

However, when a non-self-polymerizing crosslinking agent is used, then the crosslinking agent molecules do not mutually polymerize with each other at least during or before the crosslinking step, and therefore, in the crosslinked parts of the carbon nanotubes bonding to each other, there exists only the residue resulting from the crosslinking reaction of one crosslinking agent, as the linking group between the residues that remain after the crosslinking reaction of the functional groups. As a result, the characteristics of the carbon nanotube structure thus constructed may be unified as a whole.

If the crosslinking agent used does not crosslink with each other, then the space between the crosslinked carbon nanotubes may be controlled even when plural types of non-self-polymerizing crosslinking agents are mixed and carbon nanotubes are crosslinked with the resulting mixture of such plural types of crosslinking agents, and this brings about the same effect as above of reducing the fluctuation of the crosslinked carbon nanotubes. On the other hand, when different crosslinking agents are used while stepwise changing them for crosslinking carbon nanotubes, then the space between the crosslinked carbon nanotubes may be controlled in the skeleton of the carbon nanotube network structure formed so far as a non-self-polymerizing crosslinking agent is used in the initial stage of crosslinking reaction, and in that case, a self-polymerizing crosslinking agent or a crosslinking agent that may crosslink with the initial crosslinking agent (or its residue) may be used in the latter stage of the crosslinking step.

Further, when a non-self-polymerizing crosslinking agent is used, then the space between the crosslinked carbon nanotubes may be controlled in accordance with the size of one unit of the chemical structure (this may be referred to as a residue) of the crosslinked agent having been spent for the crosslinking reaction, and therefore the desired carbon nanotube network structure may be obtained at high reproducibility. In addition, when the size of the residue of the crosslinking agent is reduced, then the space between the crosslinked carbon nanotubes may be narrowed so that they may be electrically and physically extremely near to each other, and, the carbon nanotubes in the structure may be tightly crosslinked to each other.

Accordingly, when the crosslinking agent for use herein is such a non-self-polymerizing crosslinking agent, then the carbon nanotube structure formed in the invention may exhibit the electric characteristics and the mechanical characteristics of the carbon nanotubes therein to an extremely high order.

The terminology "self-polymerizability" as referred to herein is meant to indicate that the crosslinking agent has the property of mutual polymerization with each other in the presence or absence of any other component such as water; and the terminology "non-self-polymerizability" is meant to indicate that the crosslinking agent does not have the property.

When a non-self-polymerizing crosslinking agent is selected for use herein, then the crosslinked part at which carbon nanotubes are crosslinked to each other in the carbon nanotube structure may have essentially the same crosslinking structure. The linking group preferably has a skeleton of hydrocarbon, and the number of the carbon atoms constituting it is preferably from 2 to 10. Reducing the number of the carbon atoms to constitute the group results in the reduction in the length of the crosslinked parts, and, as a result, the space between the crosslinked carbon nanotubes may be fully reduced as compared with the length of the carbon nanotubes themselves, whereby the carbon nanotube structure may have a network structure substantially composed of carbon nanotubes alone. Accordingly, the electron beam generator device of the invention of this embodiment may have higher electroconductivity and mechanical strength.

In the first embodiment as above, the functional group includes —OH, —COOH, —COOR (R represents a substituted or unsubstituted hydrocarbon group), —COX (X represents a halogen atom), —NH$_2$ and —NCO. Preferably, at least one of these is selected for the functional group. In this case, the crosslinking agent is so selected that it undergoes crosslinking reaction with the thus-selected functional group.

Preferred examples of the crosslinking agent are polyols, polyamines, polycarboxylic acids, polycarboxylates, polycarboxylic acid halides, polycarbodiimides and polyisocyanates. Preferably at least any one of these is selected for the crosslinking agent for use herein. In this case, the functional group is so selected that it undergoes crosslinking reaction with the thus-selected crosslinking agent.

Preferably, at least one functional group and at least one crosslinking agent are each selected from the group of the preferred functional groups mentioned above and the group of the preferred crosslinking agents mentioned above, respectively, in such a manner that they may undergo mutual crosslinking reaction with each other.

The functional group is more preferably —COOR (R represents a substituted or unsubstituted hydrocarbon group). Introducing a carboxyl group into carbon nanotubes is relatively easy and the resulting substance (carbon nanotube-carboxylic acid) is highly reactive. Therefore, it is relatively easy to esterify the acid to thereby change the functional group into —COOR (R is a substituted or unsubstituted hydrocarbon group). The resulting functional group may readily undergo crosslinking reaction, and is therefore suitable for forming crosslinked substances.

The crosslinking agent corresponding to the functional group may be polyol. Polyol cures through reaction with —COOR (R is a substituted or unsubstituted hydrocarbon group) and readily forms strong crosslinked substances. Of polyols, more preferred are glycerin, ethylene glycol, butenediol, hexynediol, hydroquinone and naphthalenediol, as their reactivity with the above-mentioned functional groups is good and, in addition, their self-degradability is high and their load on the environment is low. Accordingly, it is desirable that at least one polyol is selected from the group consisting of these.

The crosslinked parts at which the above-mentioned plural carbon nanotubes are mutually crosslinked with each other are —COO(CH$_2$)$_2$OCO— when the functional group is —COOR (R is a substituted or unsubstituted hydrocarbon group) and the crosslinking agent is ethylene glycol; or —COOCH$_2$CHOHCH$_2$OCO— or —COOCH$_2$CH(OCO—)CH$_2$OH, when the crosslinking agent is glycerin and when its two OH groups participate in the crosslinking reaction; or —COOCH$_2$CH(OCO—)CH$_2$OCO— when its three OH groups participate in the crosslinking reaction. The chemical structure of the crosslinked parts may be any one selected from the group of the above-mentioned four.

In the first embodiment of the method for producing the electron beam generator device of the invention, the plural carbon nanotubes having the above-mentioned functional groups and the crosslinking agent that are used in the supply step are put into a solvent to prepare a crosslinking solution, and the resulting solution may be applied to the surface of a base body. Depending on the type thereof, the crosslinking agent may serve also as the solvent.

In another preferred embodiment of forming the crosslinked parts of the functional groups in a mode chemical bonding of the groups to each other in the crosslinking step in the method of producing the electron beam generator of the invention, the plural functional groups are chemically bonded to each other.

In this embodiment, the size of the crosslinked parts where the carbon nanotubes are bonded to each other may be kept constant depending on the type of the functional groups to be bonded thereto. Carbon nanotubes have an extremely stable chemical structure, and there is a low possibility that any other functional groups than the functional groups for modification of carbon nanotubes may bond thereto. When the functional groups bonding to carbon nanotubes are bonded in a mode of chemical bonding, then the crosslinked part may have the planned structure and the carbon nanotube structure thus formed may be homogeneous.

In addition, since the functional groups are bonded to each other in a mode of chemical bonding in this embodiment, the length of the crosslinked parts between the bonded carbon nanotubes may be shortened as compared with the other case where the functional groups are crosslinked with a crosslinking agent. Accordingly, the carbon nanotube structure formed may be a tight structure, and it can readily exhibit the effect intrinsic to carbon nanotubes.

The reaction to form the chemical bonding of the functional groups is preferably any of dehydration condensation, substitution reaction, addition reaction or oxidation reaction.

In the method for producing the electron beam generator device of the invention, some molecules having the above-mentioned functional groups may be bonded to carbon nanotubes and they may be chemically bonded to each other at the functional groups to constitute the intended crosslinked parts.

In the supply step, an additive to form the chemical bonding of the functional groups to each other may be further applied to the surface of the base body.

When the reaction to form the chemical bonding of the functional groups to each other is dehydration condensation, then a condensing agent is preferably added to the system as the additive thereto. Preferably, the condensing agent is at least anyone selected from a group consisting of sulfuric acid, N-ethyl-N'-(3-dimethylaminopropyl)carbodiimide and dicyclohexylcarbodiimide.

The functional group for the dehydration condensation is preferably at least any one selected from a group consisting of —COOR (R is a substituted or unsubstituted hydrocarbon group), —COOH, —COX (X is a halogen atom), —OH, —CHO and —$NH_2$.

The functional group for the dehydration condensation is especially preferably —COOH. Introducing the carboxyl group into carbon nanotubes is relatively easy and the resulting substance (carbon nanotube-carboxylic acid) is highly reactive. Therefore, it is easy to introduce a functional group for forming a network structure into plural sites of one carbon nanotube, and the functional group readily undergoes dehydration condensation and is therefore suitable for forming the intended carbon nanotube structure.

When the reaction for chemical bonding of the functional groups to each other is substitution reaction, then the additive is preferably a base. More preferably, the base is at least any one selected from a group consisting of sodium hydroxide, potassium hydroxide, pyridine and sodium ethoxide. In this case, the functional group is preferably at least any one selected from a group consisting of —$NH_2$, —X (X is a halogen atom), —SH, —OH, —$OSO_2CH_3$ and —$OSO_2(C_6H_4)CH_3$.

When the reaction for chemical bonding of the functional groups to each other is addition reaction, then the functional group is preferably —OH and/or —NCO.

When the reaction for chemical bonding of the functional groups to each other is an oxidation reaction, then the functional group is preferably —SH. In this case, the above-mentioned additive is not always needed, but adding an oxidation reaction accelerator to the system as the additive thereto is a preferred embodiment of this case. One preferred example of the oxidation reaction accelerator is iodine.

In the second embodiment of the method for producing the electron beam generator device of the invention, the plural carbon nanotubes having the above-mentioned functional groups and optionally the above-mentioned additives that are used in the supply step are put into a solvent to prepare a crosslinking solution, and the resulting solution may be applied to the surface of a base body.

On the other hand, a method for producing the electron beam generator device of the invention, in which the carbon nanotube structure forms a complex with an aliphatic polyketone polymer, differs from the production method mentioned hereinabove. This is referred to as a second production method.

The second production method comprises at least the following:

a supply step of applying a polyalcohol and a plurality of carbon nanotubes each having functional group capable of polymerizing with the polyalcohol, to a conductive surface of a base body; and a crosslinking step of crosslinking the polyalcohol and the functional groups mutually with a chemical bond in a presence of a catalyst.

In the supply step in the second production method, a polyalcohol and plural carbon nanotubes having functional groups capable of polymerizing with the polyalcohol are fed to a conductive surface of a base body. When a solution containing these starting materials (crosslinking solution) is used, then the crosslinking solution may be applied to the surface of a base body. In this case, a catalyst for use in the next step may be previously added to the crosslinking solution.

In the next crosslinking step, the polyalcohol and the functional groups that the carbon nanotubes have are chemically bonded separately or together to each other in the presence of a catalyst for polymerization. This forms a carbon nanotube structure to constitute a network structure of the plural carbon nanotubes mutually electrically connected to each other, and, in addition, an aliphatic polyketone polymer is formed through polymerization of the polyalcohol, and these are also crosslinked to each other to form a network structure complex of the two compounded to each other.

Via the two steps, a complex of the carbon nanotube structure and the aliphatic polyketone polymer is formed and stabilized on the surface of the base body.

According to the second production method, the characteristics of carbon nanotubes are effectively utilized to realize electron beam emission at high current density, and electron beam generator devices that have high mechanical strength and good heat resistant comparable to or near to those of engineering plastics can be produced in a simplified manner at low costs. In the method, in addition, a composition that contains a polyether-ketone polymer not having an aromatic group is used as the starting material, and the reaction steps are simple and their load on the environment is low. To that effect, the method is suitable to industrial production as polyalcohols that are easier to deal with than petroleum materials are used.

In this case, the functional groups capable of polymerizing with the polyalcohols, which the carbon nanotubes have, are not specifically defined, but are preferably a carboxyl group.

According to the invention, it is achieved to provide an electron beam generator device which may effectively utilize the characteristics of carbon nanotubes and has good producibility and which can realize electron beam emission at high current density.

According to the invention, it is also achieved to provides a method for producing such an electron beam generator device having the above-mentioned excellent characteristics, in a simplified manner within a shortened period of time.

The electron beam generator device and the method for producing it of the invention are described concretely hereinunder.

[Electron Beam Generator Device]

The electron beam generator device of the invention has, a base body having a conductive surface and a carbon nanotube structure on the conductive surface of the base body. The carbon nanotube structure constitutes a network structure which has a plurality of carbon nanotubes and a crosslinked part including a chemical bond of a plurality of functional groups, the chemical bond at least connecting one end of one of the carbon nanotubes to another one of the carbon nanotubes.

Figure 2:
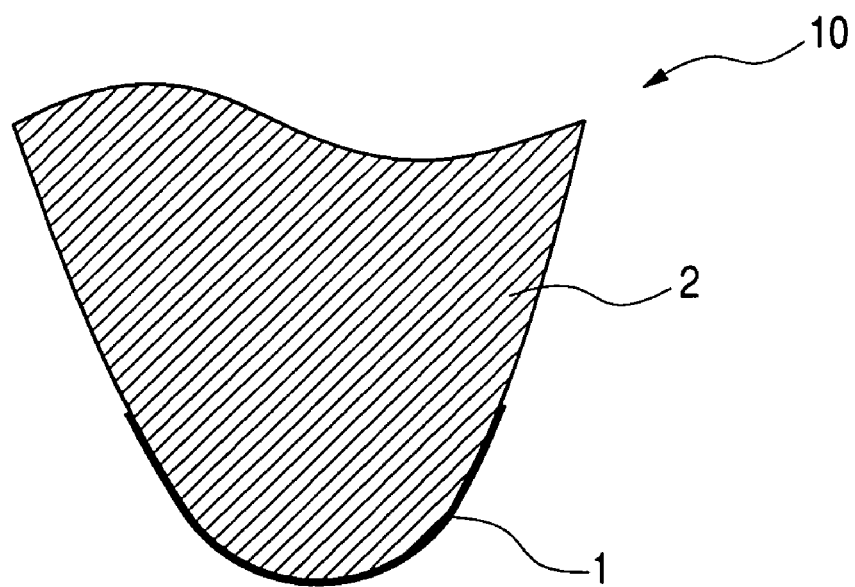
FIG. 2 is an enlarged cross-sectional view of the electron beam generator device of FIG. 1.

FIG. 1 shows an enlarged front view of one illustrative embodiment of the electron beam generator device of the invention; FIG. 2 shows a cross-sectional view of FIG. 1.

As in FIG. 1 and FIG. 2, the electron beam generator device 10 of this embodiment has a carbon nanotube structure 1 formed on the conductive surface of the top end of a base body 2.

The electron beam generator device 10 is usable as the electron source (electron gun) of electron microscopes.

Not specifically defined, the base body 2 having a conductive surface may be any and every one whose surface is conductive. For example, only the surface of the base body may be coated with a conductive material, or the base body is wholly formed of a conductive material. Depending on its use, when the electron beam generator device 10 is required to be resistant to heat, then a heat-resistant material may be suitably used for the base body.

Though not specifically defined, the material for the surface or the whole of the conductive surface-having base body 2 is preferably various metals. Concretely, for example, it includes W, Mo and Ta. Also preferred for it are borides, carbides and nitrides such as $LaB_6$, ZrC, TiC, TaC, HfC, GaN; as well as semiconductor Si and diamond. In addition, other carbon materials such as DLC (diamond-like carbon) are also preferred. Of those, more preferred are W and $LaB_6$ in view of the heat resistance and the work function thereof; and even more preferred is W since it is inexpensive and has high electroconductivity and good heat resistance.

The shape of the base body 2 may be generally the same as that of the electron generator member for the electron gun of electron microscopes. There is no specific limitation on the preferred shape of the electron beam generator device of the invention. Accordingly, the electron beam generator device of the invention may be directly applied to conventional electron microscopes as the electron beam generator device thereof.

The carbon nanotube structure 1, the point of the invention, is described below.

In the invention, the "carbon nanotube structure" is a structure to constitute a network structure has plural of carbon nanotubes and a crosslinked part including a chemical bond of plural of functional groups, the chemical bond at least connecting one end of one of the carbon nanotubes to another one of the carbon nanotubes. So far as the carbon nanotube structure can be so formed that the carbon nanotubes therein may be mutually crosslinked to constitute a network structure, it may be formed in any method. Preferably, however, the structure is formed according to the method of producing the embodiment of the electron beam generator device mentioned below, since it is easy to form and it readily gives high-performance electron beam generator devices and since its characteristics can be readily homogenized and controlled.

In one embodiment of the carbon nanotube structure that is produced according to the production method mentioned below for electron beam generator devices, the crosslinked parts are formed by curing the functional group-having carbon nanotubes with a crosslinking agent that causes crosslinking reaction with the functional groups, whereby the functional groups that the carbon nanotubes have are reacted with the crosslinking agent in a mode of crosslinking reaction to form the crosslinked parts. In another embodiment of the carbon nanotube structure, the functional groups of the carbon nanotubes are chemically bonded to each other to form the crosslinked parts.

One example of the production method is described below, and the carbon nanotube structure 1 in the electron beam generator device of this embodiment is described with reference to the example. When not specifically described hereinunder, the structure of the crosslinked parts is not specifically defined. The other embodiment of the electron beam generator device, in which the carbon nanotube structure forms a complex thereof with an aliphatic polyketone polymer, may be similar to the embodiment described herein in point of their basic structure, but they differ in point of their production method. Therefore, the other embodiment will be described later in a different section, "Second Production Method".

<Carbon Nanotubes>

The carbon nanotubes as the essential constitutive element in the invention may be single-walled carbon nanotubes (SWNT) or two-walled or more multi-walled carbon nanotubes (MWNT). Multi-walled carbon nanotubes of high electric conductivity are especially preferred for increasing the electroconductivity of the electron beam generator devices to be finally obtained herein. Another advantage of MWNT is that, when functional groups are bonded to them, they hardly break the graphene sheet in the inner layer of the carbon nanotubes, and the characteristics of the carbon nanotubes are hardly worsened. Selecting either type of carbon nanotubes or combining the two types thereof may be suitably determined depending on the use of the electron beam generator devices to be produced herein and in consideration of the costs thereof.

Modifications of single-walled carbon nanotubes such as carbon nanohorns (horn types of which the diameter enlarges continuously from one end to the other end thereof), carbon nanocoils (coil types that are spiral as a whole), carbon nanobeads (spherical beads of amorphous carbon or the like, having a tube running through the center thereof), cup-stacked nanotubes, carbon nanotubes coated with carbon nanohorns or amorphous carbon, and others that do not strictly have a tubular form may also be used as carbon nanotubes in the invention.

In addition, metal intercalate nanotubes with metal intercalated in carbon nanotubes; peapod nanotubes with fullerene or metal intercalate fullerene intercalated in carbon nanotubes; and other types of carbon nanotubes with any other substance intercalated in carbon nanotubes are also usable as carbon nanotubes in the invention.

As mentioned above, any types of carbon nanotubes such as general carbon nanotubes and their variations or modifications are usable in the invention with no problem in view of their reactivity. Accordingly, the concept of "carbon nanotubes" as referred to herein includes all of these.

The carbon nanotubes may be produced in any known method of arc discharging, laser ablation, or CVD, and there is no limitation thereon in the invention. Of those, preferred is an arc discharging method in a magnetic field as giving high-purity carbon nanotubes.

Preferably, the diameter of the carbon nanotubes for use herein is from 0.3 nm to 100 nm. If the diameter thereof is larger than the range, then the carbon nanotubes are difficult to produce and are unfavorable in point of their cost. More preferably, the uppermost limit of the diameter of the carbon nanotubes is at most 30 nm.

On the other hand, the lowermost limit of the diameter of the carbon nanotubes may be 0.3 nm or so in view of the structure thereof, but if too thin, the carbon nanotubes will be unfavorable since the yield in their production will be low. Preferably, therefore, the diameter of the carbon nanotubes is at least 1 nm, more preferably at least 10 nm.

The length of the carbon nanotubes for use herein is preferably from 0.1 μm to 100 μm. If the length thereof is larger than the range, then the carbon nanotubes are difficult to produce or may require some specific method for their production, and therefore they are unfavorable in view of their costs. If, on the other hand, the length thereof is smaller than the range, the carbon nanotubes are unfavorable since the number of the crosslinking and bonding points per one carbon nanotube will decrease. More preferably, the uppermost limit of the length of the carbon nanotubes is at most 10 μm, and the lowermost limit thereof is at least 1 μm.

When the purity of the carbon nanotubes that are to be used herein is not high, then it is desirable that the carbon nanotubes are previously purified so as to increase their purity before preparing the crosslinking solution that contains them. In the invention, the purity of the carbon nanotube is preferably as high as possible. Concretely, it is desirable that the purity is at least 90%, more preferably at least 95%. If the purity is low, then the impurities, amorphous carbon and other carbon products such as tar may crosslink with the crosslinking agent used, whereby the crosslinking distance between the carbon nanotubes may fluctuate and the crosslinked carbon nanotubes could not have the desired characteristics. There is no specific limitation on the method of purifying the carbon nanotubes, and any known method may be employable for the purification.

With predetermined functional groups added thereto, the carbon nanotubes are used for forming the carbon nanotube structure in the invention. Preferred examples of the functional groups to be added to the carbon nanotubes differ, depending on the first embodiment and the second embodiment mentioned above. Those for the former are referred to as "functional group 1" and those for the latter are as "functional group 2".

The method for introducing the functional groups to the carbon nanotubes is described in the section of (method of preparing crosslinking solution) given hereinunder.

The constitutive components applicable to the formation of the carbon nanotube structure are described below, separately for the first embodiment and the second embodiment.

First Embodiment

In the first embodiment where a crosslinking agent is used for forming the crosslinked parts, the functional groups that the carbon nanotubes have are not specifically defined so far as they can be chemically added to carbon nanotubes and can undergo crosslinking reaction with any crosslinking agent. Accordingly, any functional groups may be selected for these. Concretely, the functional groups include —COOR, —COX, —MgX, —X (X represents a halogen atom), —OR, —NR$^1$R$^2$, —NCO, —NCS, —COOH, —OH, —NH$_2$, —SH, —SO$_3$H, —R'CHOH, —CHO, —CN, —COSH, —SR, —SiR'$_3$ (R, R$^1$, R$^2$ and R' each independently represent a substituted or unsubstituted hydrocarbon group), to which, however, the invention should not be limited.

Of those, preferred is at least one selected from a group consisting of —OH, —COOH, —COOR (R is a substituted or unsubstituted hydrocarbon group), —COX (X is a halogen atom), —NH$_2$ and —NCO. In this case, the crosslinking agent is so selected that it undergoes crosslinking reaction with the thus-selected functional group.

In particular, —COOR (R is a substituted or unsubstituted hydrocarbon group) is especially preferred, since introducing a carboxyl group into carbon nanotubes is relatively easy and the resulting substance (carbon nanotube-carboxylic acid) may be readily esterified so as to introduce the intended functional group to carbon nanotubes. Another advantage thereof is that the reactivity of the group with a crosslinking agent is good.

R in the functional group —COOR is a substituted or unsubstituted hydrocarbon group and there is no specific limitation on it. However, in view of the reactivity, the solubility, the viscosity and the applicability thereof to solvent for coating compositions, the group is preferably an alkyl group having from 1 to 10 carbon atoms, more preferably from 1 to 5 carbon atoms. Even more preferably, it is a methyl or ethyl group.

The dose of functional group applicable to carbon nanotubes could not be indiscriminately defined, as varying depending on the length and the thickness of the carbon nanotubes, the type thereof as to whether they are single-walled or multi-walled, the type of the functional groups and the use of the electron beam generator devices. Preferably, however, the dose is such that at least two functional groups may be added to one carbon nanotube, in view of the strength of the resulting crosslinked body, or that is, the strength of the crosslinked film.

The method for introducing functional groups into carbon nanotubes will be described in the section "method for producing electron beam generator device" given hereinunder.

In the first embodiment, the crosslinking agent is an indispensable ingredient. It may be any and every one capable of undergoing crosslinking reaction with the functional groups that the carbon nanotubes have. In other words, the type of the crosslinking agent that may be selected for use herein will be limited in some degree, depending on the type of the functional groups. The curing condition (heating, UV irradiation, visible light irradiation, spontaneous curing) for the crosslinking reaction shall be naturally determined in accordance with the combination of these.

Concretely, preferred examples of the crosslinking agent are polyols, polyamines, polycarboxylic acids, polycarboxylates, polycarboxylic acid halides, polycarbodiimides and polyisocyanates. Preferably, at least one crosslinking agent is selected from the group of these for use herein. In this case, the functional groups are so selected that they may undergo crosslinking reaction with the thus-selected crosslinking agent.

Especially preferably, at least one functional group and at least one crosslinking agent are selected from the group of the preferred functional groups mentioned above and the group of the preferred crosslinking agents also mentioned above, respectively, in such a manner that they may undergo mutual crosslinking reaction with each other. Some combinations of the functional group that the carbon nanotubes have and the crosslinking agent corresponding to it and capable of crosslinking with it are shown in Table 1 below, along with the curing condition for them.

TABLE 1

| Functional Group of Carbon Nanotubes | Crosslinking Agent | Curing Condition |
| --- | --- | --- |
| —COOR | polyol | thermal curing |
| —COX | polyol | thermal curing |
| —COOH | polyamine | thermal curing |
| —COX | polyamine | thermal curing |
| —OH | polycarboxylate | thermal curing |
| —OH | polycarboxylic acid halide | thermal curing |

TABLE 1-continued

| Functional Group of Carbon Nanotubes | Crosslinking Agent | Curing Condition |
| --- | --- | --- |
| —NH$_2$ | polycarboxylic acid | thermal curing |
| —NH$_2$ | polycarboxylic acid halide | thermal curing |
| —COOH | polycarbodiimide | thermal curing |
| —OH | polycarbodiimide | thermal curing |
| —NH$_2$ | polycarbodiimide | thermal curing |
| —NCO | polyol | thermal curing |
| —OH | polyisocyanate | thermal curing |
| —COOH | ammonium complex | thermal curing |
| —COOH | hydroquinone | thermal curing |

*R is a substituted or unsubstituted hydrocarbon group.
*X is a halogen atom.

Of those combinations, preferred are combinations of a functional group, —COOR (R is a substituted or unsubstituted hydrocarbon group) of high reactivity, and a crosslinking agent, polyol, polyamine, ammonium complex, Congo Red or cis-platin capable of forming firmly-crosslinked bodies. The terms "polyol", "polyamine" and "ammonium complex" as referred to herein are generic terms for organic compounds having at least two OH, NH$_2$ or ammonium groups, respectively. Of the compounds, preferred are those having from 2 to 10 (more preferably from 2 to 5) carbon atoms and from 2 to 22 (more preferably from 2 to 5) OH groups, in view of the crosslinkability thereof, the solvent compatibility thereof in case of excess over solvent, the processability of waste after reaction owing to the biodegradability thereof (ecological quality), and the yield in their production. In particular, the number of the carbon atoms constituting them is as small as possible within the defined range as above, from the viewpoint that the distance between the crosslinked carbon nanotubes in the resulting crosslinked film could be narrowed and the crosslinked carbon nanotubes could be in substantial contact with each other. Concretely, glycerin and ethylene glycol are preferred. One or both of these are preferably used for the crosslinking agent.

From a different viewpoint, the crosslinking agent is preferably a non-self-polymerizing crosslinking agent. Not only glycerin and ethylene glycol mentioned hereinabove for examples of polyol, but also butene-diol, hexyne-diol, hydroquinone and naphthalene-diol are non-self-polymerizing crosslinking agents. More generally, the condition of the non-self-polymerizing crosslinking agent is that it does not have, in itself, a combination of functional groups that may mutually polymerize with each other. On the contrary, a self-polymerizing crosslinking agent has, in itself, a combination of functional groups that may mutually polymerize with each other (e.g., alkoxide).

For forming the carbon nanotube structure in this embodiment, plural carbon nanotubes having the above-mentioned functional groups, and the above-mentioned crosslinking agent are applied to the surface of the above-mentioned base body (having a conductive surface) (this is the supply step in the method for producing the electron beam generator device of the invention), and the functional groups are bonded to each other in a mode of chemical bonding to thereby form crosslinked parts (this is the crosslinking step in the method for producing the electron beam generator device of the invention). When the plural carbon nanotubes having the above-mentioned functional groups, and the above-mentioned crosslinking agent are applied to the surface of the above-mentioned base body, a solution that contains these and a solvent (crosslinking solution) may be applied to the base body surface, and in particular, the solution may be applied as a coating solution to the base body surface to form a crosslinked film thereon. This is favorable since it is simple and inexpensive and it may be attained within a short period of time.

The content of the carbon nanotubes in the crosslinking solution could not be indiscriminately defined, as varying depending on the length and the thickness of the carbon nanotubes, the type thereof as to whether they are single-walled or multi-walled, the type and the amount of the functional groups that the nanotubes have, the type and the amount of the crosslinking agent, and the presence or absence, as well as the type and the amount of solvent and other additives. It is desirable that the concentration of the carbon nanotubes is high to such a degree that they form a good crosslinked film after curing. However, if too thick, the coating solution may lower its coatability. Therefore, it is desirable that the concentration of the carbon nanotubes in the coating solution is not too high.

The concrete ratio of the carbon nanotubes is not also indiscriminately defined as so mentioned hereinabove, but it maybe selected from a range falling between 0.01 and 10 g/liter or so, preferably between 0.1 and 5 g/liter or so, more preferably between 0.5 and 1.5 g/liter or so, relative to the whole amount of the crosslinking solution not including the mass of the functional groups.

The content of the crosslinking agent to be in the crosslinking solution is not also indiscriminately defined, as varying depending not only on the type of the crosslinking agent (including the matter as to whether it is self-polymerizing or non-self-polymerizing), but also on the length and the thickness of the carbon nanotubes, the type thereof as to whether they are single-walled or multi-walled, the type and the amount of the functional groups that the nanotubes have, and the presence or absence, as well as the type and the amount of solvent and other additives. In particular, glycerin and ethylene glycol are not so viscous by themselves, and can serve also as solvent. Accordingly, they may be excessively in the crosslinking solution.

The crosslinking solution may require a solvent when only the crosslinking agent therein is unsatisfactory for the coatability thereof. The usable solvent is not specifically defined and may be selected depending on the type of the crosslinking agent used. Concretely, it includes organic solvents such as methanol, ethanol, isopropanol, n-propanol, butanol, methyl ethyl ketone, toluene, benzene, acetone, chloroform, methylene chloride, acetonitrile, diethyl ether, tetrahydrofuran (THF); and water, aqueous solution of acid, aqueous solution of alkali. Not specifically defined, the amount of the solvent to be in the crosslinking solution may be suitably determined in consideration of the coatability of the solution.

Second Embodiment

In the second embodiment, plural functional groups are directly bonded to each other in a mode of chemical bonding therebetween, not using a crosslinking agent, to from crosslinked parts. In this, the functional groups that the carbon nanotubes have are not specifically defined and may be selected from any functional groups so far as they may be chemically added to the carbon nanotubes, may be reacted together when some additive is added thereto. Concretely, the functional groups include —COOR, —COX, —MgX, —X (X represents a halogen atom), —OR, —NR$^1$R$^2$, —NCO, —NCS, —COOH, —OH, —NH$_2$, —SH, —SO$_3$H, —R'CHOH, —CHO, —CN, —COSH, —SR, —SiR'$_3$ (R, $R^1$, $R^2$ and R' each independently represent a substituted or unsubstituted hydrocarbon group), to which, however, the invention should not be limited.

The reaction to cause the chemical bonding of the functional groups to each other is especially preferably any of dehydration condensation, substitution reaction, addition reaction or oxidation reaction. The functional groups that are preferred for each reaction are mentioned below. In condensation reaction, at least any one selected from —COOR (R is a substituted or unsubstituted hydrocarbon group), —COOH, —COX (X is a halogen atom), —OH, —CHO and —NH$_2$ is preferred; in substitution reaction, at least any one selected from —NH$_2$, —X (X is a halogen atom), —SH, —OH, —OSO$_2$CH$_3$ and —OSO$_2$(C$_6$H$_4$)CH$_3$ is preferred; in addition reaction, at least any one selected from —OH and —NCO is preferred; and in oxidation reaction, —SH is preferred.

Molecules that contain these functional groups in a part thereof may be bonded to carbon nanotubes, and the carbon nanotubes may be chemically bonded to each other at the preferred functional sites mentioned hereinabove. Also in this case, the functional groups having a large molecular weight and bonding to carbon nanotubes are intentionally bonded to the carbon nanotubes, and therefore the length of the crosslinked parts may be controlled.

When the functional groups are chemically bonded to each other, an additive to cause the chemical bonding of the functional groups may be used. The additive may be any and every one having the ability to react the functional groups that the carbon nanotubes have to each other. In other words, the type of the additive usable herein may be limited in some degree, depending on the type of the functional groups and the type of the reaction. In addition, the combination of these shall naturally define the curing condition for the reaction (e.g., heating, UV irradiation, visible light irradiation, spontaneous curing).

When the reaction for the chemical bonding of the functional groups to each other is dehydration condensation, then the additive is preferably a condensing agent. Concretely, preferred examples of the condensing agent are sulfuric acid, N-ethyl-N'-(3-dimethylaminopropyl)carbodiimide and dicyclohexylcarbodiimide. Preferably, at least any one of these is selected for the condensing agent. In this case, the functional groups are so selected that they react with each other in the presence of the thus-selected condensing agent.

The functional group for the dehydration condensation is preferably at least any one selected from a group consisting of —COOR (R is a substituted or unsubstituted hydrocarbon group), —COOH, —COX (X is a halogen atom), —OH, —CHO and —NH$_2$.

The functional group for the dehydration condensation is especially preferably —COOH. Introducing the carboxyl group into carbon nanotubes is relatively easy and the resulting substance (carbon nanotube-carboxylic acid) is highly reactive. Therefore, it is easy to introduce a functional group for forming a network structure into plural sites of one carbon nanotube, and the functional group readily undergoes dehydration condensation and is therefore suitable for forming the intended carbon nanotube structure. When the functional group for the dehydration condensation is —COOH, then the condensing agent for it is especially preferably any the above-mentioned sulfuric acid, N-ethyl-N'-(3-dimethylaminopropyl)carbodiimide and dicyclohexylcarbodiimide.

When the reaction for chemical bonding of the functional groups to each other is substitution reaction, then the additive is preferably a base. The base usable herein is not specifically defined, and may be any one selected in accordance with the degree of acidity of the hydroxyl group thereof. Concretely, preferred examples of the base are sodium hydroxide, potassium hydroxide, pyridine and sodium ethoxide. At least any one may be selected from these for the base for use herein. In this case, the functional groups are so selected that they may undergo substitution reaction by the action of the thus-selected base. The functional groups are preferably at least any one selected from a group consisting of —NH$_2$, —X (X is a halogen atom), —SH, —OH, —OSO$_2$CH$_3$ and —OSO$_2$(C$_6$H$_4$)CH$_3$.

When the reaction for chemical bonding of the functional groups to each other is addition reaction, then an additive to it is not always necessary. In this case, the functional group is preferably —OH and/or —NCO.

When the reaction for chemical bonding of the functional groups to each other is an oxidation reaction, then an additive to it is not always necessary but an oxidation reaction accelerator is preferably added as the additive thereto. One preferred example of the oxidation reaction accelerator is iodine. In this case, the functional group is preferably —SH.

Preferably, at least two functional groups are selected from the preferred examples thereof mentioned above so that they may undergo mutual reaction with each other, and are bonded to carbon nanotubes. Functional groups (A) and (B) which carbon nanotubes are to have and which undergo mutual crosslinking reaction with each other, and the type of the reaction corresponding to them are shown in Table 2 below.

TABLE 2

| Crosslinking moiety | Functional Groups of Carbon Nanotubes | | Reaction |
|---|---|---|---|
| | (A) | (B) | |
| —COOCO— | —COOH | —COOH | dehydration condensation |
| —S—S— | —SH | —SH | oxidation reaction |
| —O— | —OH | —OH | dehydration condensation |
| —NH—CO— | —COOH | —NH$_2$ | dehydration condensation |
| —COO— | —COOH | —OH | dehydration condensation |
| —COO— | —COOR | —OH | dehydration condensation |
| —COO— | —COX | —OH | dehydration condensation |
| —CH=CH— | —CHO | —NH$_2$ | dehydration condensation |
| —NH— | —NH$_2$ | -X | substitution reaction |
| —S— | —SH | -X | substitution reaction |
| —O— | —OH | -X | substitution reaction |
| —O— | —OH | —OSO$_2$CH$_3$ | substitution reaction |
| —O— | —OH | —OSO$_2$(C$_6$H$_4$)CH$_3$ | substitution reaction |
| —NH—COO— | —OH | —N=C=O | addition reaction |

*R is a substituted or unsubstituted hydrocarbon group.
*X is a halogen atom.

For forming the carbon nanotube structure in this embodiment, plural carbon nanotubes having the above-mentioned functional groups, and optionally the above-mentioned additives are applied to the surface of the above-mentioned base body (having a conductive surface) (this is the supply step in the method for producing the electron beam generator device of the invention), and the functional groups are bonded to each other in a mode of chemical bonding to thereby form crosslinked parts (this is the crosslinking step in the method for producing the electron beam generator device of the invention). When the plural carbon nanotubes having the above-mentioned functional groups are applied to the surface of the above-mentioned base body, a solution that contains these and a solvent (crosslinking solution) may be applied to the base body surface, and in particular, the solution may be applied as a coating solution to the base body surface to form a crosslinked film thereon. This is favorable since it is simple and inexpensive in producing the electron beam generator device of the invention and it may be attained within a short period of time.

The concept of the content of the carbon nanotubes in the crosslinking solution is basically the same as that in the first embodiment mentioned hereinabove.

The content of the additive that maybe in the crosslinking solution is not indiscriminately defined, as varying depending not only on the type of the additive (including the matter as to whether it is self-polymerizing or non-self-polymerizing), but also on the length and the thickness of the carbon nanotubes, the type thereof as to whether they are single-walled or multi-walled, the type and the amount of the functional groups that the nanotubes have, and the presence or absence, as well as the type and the amount of solvent and other additives. In particular, glycerin and ethylene glycol are not so viscous by themselves, and can serve also as solvent. Accordingly, they may be excessively in the crosslinking solution.

The crosslinking solution may require a solvent when only the additive for bonding functional groups therein is unsatisfactory for the coatability thereof. The usable solvent is not specifically defined and may be selected depending on the type of the additives used. Regarding the concrete examples of the solvent and the amount thereof, referred to are the same as those mentioned hereinabove in the section of the first embodiment.

(Other Additives)

The crosslinking solution (both in the first and second embodiments) may contain any other various additives such as viscosity improver, dispersant, crosslinking promoter, etc.

The viscosity improver maybe added to the solution when only the crosslinking agent or the additive for bonding functional groups therein is unsatisfactory for the coatability of the solution. The usable viscosity improver is not specifically defined and may be selected depending on the type of the crosslinking agent or the other additives used. Concretely, it includes methanol, ethanol, isopropanol, n-propanol, butanol, methyl ethyl ketone, toluene, benzene, acetone, chloroform, methylene chloride, acetonitrile, diethyl ether, THF, etc.

Some of these viscosity improvers may serve as a solvent, depending on the amount thereof added to the solution. It is meaningless to clearly differentiate the functions of the two, viscosity improver and solvent. Not specifically defined, the amount of the viscosity improver may be suitably determined in consideration of the coatability of the crosslinking solution.

The dispersant is added to the crosslinking solution so as to ensure the dispersion stability of the carbon nanotubes, the crosslinking agent and the additive for bonding functional groups in the solution, and may be any of various known surfactants, water-soluble organic solvents, water, aqueous acid solutions, aqueous alkali solutions, etc. However, the constitutive components of the crosslinking agent have high dispersion stability by themselves, and therefore the dispersant is not always necessary. Depending on the use thereof, some crosslinked films formed are desired not to contain impurities such as dispersant. In that case, needless-to-say, a dispersant is not added to the solution, or if added thereto, its amount is preferably as small as possible.

(Method for Preparing Crosslinking Solution)

A method for preparing the crosslinking solution is described.

The crosslinking solution may be prepared by mixing carbon nanotubes having functional groups with a crosslinking agent capable of crosslinking with the functional groups, or an additive for chemical bonding of the functional groups (mixing step). Prior to the mixing step, the method may include an addition step of introducing functional groups into carbon nanotubes.

When carbon nanotubes having functional groups are used as the starting material, then only the mixing step may be enough. However, when ordinary carbon nanotubes are sued as the starting material, then they require the addition step.

The addition step is for introducing desired functional groups into carbon nanotubes. The introduction method varies depending on the type of the functional groups, and therefore could not be indiscriminately defined. Desired functional groups may be directly added to carbon nanotubes; or after some other readily-addable functional groups are once introduced into carbon nanotubes, and then a part of the thus-introduced functional groups may be substituted or any other functional groups may be added to them so as to finally introduce the intended functional groups into carbon nanotubes.

If desired, some mechanochemical force may be applied to carbon nanotubes to thereby break or modify only a minor slight part of the graphene sheet of the surface of the carbon nanotubes, and various functional groups maybe introduced into that part.

When cup-stacked nanotubes or nanotubes formed in a mode of vapor phase growth, which have many surface defects initially at their production, are used, then functional groups may be relatively easily introduced into them. However, carbon nanotubes having a complete graphene structure are better as their characteristics are more effective and can be more readily controlled. Accordingly, it is especially desirable that multi-walled carbon nanotubes are used and suitable defects are formed in the outermost layer thereof as an electric wave absorptive layer, and functional groups are bonded to and crosslinked with them, while on the other hand, the inner layer thereof with few structural defects is utilized as the layer that exhibits the characteristics of carbon nanotubes.

The operation of the addition step is not specifically defined, for which any known method is usable. Various methods for it are described in JP-T 2002-503204, and these may be utilized also in the invention in accordance with the object thereof.

—COOR (R is a substituted or unsubstituted hydrocarbon group) is one favorable functional group of those mentioned above, and a method for introducing it into carbon nanotubes is described herein. For introducing —COOR (R is a substituted or unsubstituted hydrocarbon group) into carbon nanotubes, (i) a carboxyl group is first added to carbon nanotubes, and then (ii) this may be esterified.

(1) Addition of Carboxyl Group

Carbon nanotubes may be refluxed along with an acid that acts for oxidation, for introducing a carboxyl group into them. This operation is favorable, as it is relatively easy, and enables addition of a carboxyl group of high reactivity to carbon nanotubes. This is described briefly hereinunder.

The acid that acts for oxidation includes concentrated nitric acid, aqueous hydrogen peroxide, mixture of sulfuric acid and nitric acid, aqua regia, etc. In particular, when concentrated nitric acid is used, its concentration is preferably at least 5% by mass, more preferably at least 60% by mass.

The refluxing may be effected in an ordinary manner. Its temperature is preferably at around the boiling point of the acid used. For example, concentrated sulfuric acid is preferably at a temperature falling between 120 and 130° C. The refluxing time is preferably within a range between 30 minutes and 20 hours, more preferably between 1 hour and 8 hours.

In the reaction solution after refluxed, there are formed carbon nanotubes with a carboxyl group added thereto (carbon nanotube-carboxylic acid). The reaction solution is cooled to room temperature, and optionally subjected to separation or washing to obtain the intended carbon nanotube-carboxylic acid.

(ii) Esterification

An alcohol is added to the thus-obtained carbon nanotube-carboxylic acid for dehydration and esterification to thereby introduce the intended functional group —COOR (R is a substituted or unsubstituted hydrocarbon group) into the carbon nanotubes.

The alcohol used for the esterification may be determined depending on R in the formula that indicates the functional group. For example, when R is $CH_3$, then the alcohol is methanol; and when R is $C_2H_5$, then the alcohol is ethanol.

In general, a catalyst is used for esterification. In the invention, any known catalyst may be used, for example, sulfuric acid, hydrochloric acid or toluenesulfonic acid. In the invention, sulfuric acid is preferred for the catalyst from the viewpoint that it does not cause any side effect.

For the esterification, the carbon nanotube-carboxylic acid may be refluxed along with an alcohol and a catalyst added thereto, at a suitable temperature for a suitable period of time. The temperature condition and the time condition for it could not be indiscriminately defined, as varying depending on the type of the catalyst and the type of the alcohol. Preferably, the refluxing temperature is at around the boiling point of the alcohol used. For example, when methanol is used, the refluxing temperature preferably falls between 60 and 70° C. and the refluxing time preferably falls between 1 and 20 hours, more preferably between 4 and 6 hours.

The reaction product is isolated from the esterified solution, and optionally washed to obtain carbon nanotubes with the functional group —COOR (R is a substituted or unsubstituted hydrocarbon group) added thereto.

The mixing step is for mixing the functional group-having carbon nanotubes with a crosslinking agent capable of crosslinking with the functional group or an additive for functional group bonding such as that mentioned above, and optionally a solvent to prepare a crosslinking solution. In the mixing step, any other additives such as those described in the section of (other additives) may be optionally added to the solution, in addition to these ingredients. Preferably, the amount of the solvent and the viscosity improver is suitably controlled in preparing the crosslinking solution just before supply (application) to base bodys, in consideration of the coatability of the solution.

Mixing the components may be effected by stirring them merely with a spatula, or by the use of a blade stirrer, a magnetic stirrer or a stirring pump. However, for more uniformly dispersing the carbon nanotubes to improve the storage stability of the resulting dispersion, or for forming the intended network structure of crosslinked carbon nanotubes everywhere in the resulting dispersion, an ultrasonic disperser or a homogenizer maybe used for forcedly stirring and dispersing the ingredients. However, when homogenizer and other stirring devices that may give high stirring shear force are used, the carbon nanotubes in the solution may be cut or damaged. Therefore, stirring the ingredients with any of such devices may be effected within an extremely short period of time.

The crosslinking solution described hereinabove is applied to the surface of a base body and is cured thereon to form a carbon nanotube structure layer. The coating method and the curing method will be described in detail in the section of "Method for Producing Electron Beam Generator Device" to be given hereinunder.

In the carbon nanotube structure in the invention, the carbon nanotubes are in a networked condition thereof. Precisely, the carbon nanotube structure is cured as a matrix, in which the carbon nanotubes are bonded to each other via the crosslinked parts therein. Accordingly, this fully exhibits the characteristics of carbon nanotubes, such as the high transmittability of electrons and holes through them. Specifically, in the carbon nanotube structure, the carbon nanotubes are mutually tightly connected with each other with no other binder between them. Therefore, the carbon nanotube structure of the type is composed of substantially carbon nanotubes only therein, and it exhibits a maximum level of characteristics intrinsic to carbon nanotubes.

In the invention, when the carbon nanotube structure is formed as a layer, then the thickness of the layer may be broadly defined, including ultra-thin layers to thick layers. When the content of the carbon nanotubes in the crosslinking solution to be used for forming the structure is lowered (simply by thinning the solution to lower the viscosity thereof) and when this is sheetwise applied to a base body, then an ultra-thin, crosslinked film may be formed. Contrary to this, when the content of the carbon nanotubes in the solution is increased, then a thick crosslinked film may be formed. When the coating operation is repeated, then a thicker crosslinked film may be formed. The thickness of the ultra-thin crosslinked film may well be 10 nm or so, and repeated coating enables the formation of thicker crosslinked films with no limitation on the thickness thereof. The thickness of the film that may be formed in one coating operation is 5 μm or so. When the content of the ingredients in the crosslinking solution is specifically controlled and the solution is cast into a mold and crosslinked therein, then it may be formed in a desired shape.

When the carbon nanotube structure is formed according to the first embodiment mentioned above, then the crosslinked parts therein at which the carbon nanotubes are crosslinked to each other, or that is, the crosslinked parts at which the functional groups of the carbon nanotubes are crosslinked with the crosslinking agent form a crosslinked structure in which the residues remaining after the crosslinking reaction of the functional groups are bonded to each other via the linking group which the residue remaining after the crosslinking reaction of the crosslinking agent.

As so mentioned hereinabove, the crosslinking agent that is one constitutive element of the crosslinking solution in this case is a non-self-polymerizing one. When the crosslinking agent is a non-self-polymerizing one, then the linking group in the finally-formed carbon nanotube structure may be formed of the residue of only one molecule of the crosslinking agent, and this means that the distance between the crosslinked carbon nanotubes can be controlled to the size of the residue of the crosslinking agent used. Accordingly, in this case, the desired carbon nanotube network structure may be obtained at high reproducibility. In addition, since the crosslinking agent does not exist multiply between the crosslinked carbon nanotubes, the substantial density of the carbon nanotubes in the carbon nanotube structure may be increased. Further, when the size of the residue of the crosslinking agent is reduced, then the distance between the crosslinked carbon nanotubes may be narrowed so that they are electrically and physically extremely near to each other (in such a manner that the crosslinked carbon nanotubes are substantially in direct contact with each other).

When a single functional group is selected for the carbon nanotubes and a single non-self-polymerizing crosslinking agent is selected in the crosslinking solution and when the thus-selected crosslinking solution is used for forming the carbon nanotube structure, then the crosslinked parts in the structure layer may have one and the same crosslinked structure (Exemplification 1). On the other hand, when plural functional groups are selected for the carbon nanotubes and/or when plural non-self-polymerizing crosslinking agents are selected in the crosslinking solution and when the thus-selected crosslinking solution is used for forming the carbon nanotube structure, then the essential crosslinked structure of the crosslinked parts in the resulting carbon nanotube structure layer may be formed of the combination of the essential functional group and the essential non-self-polymerizing crosslinking agent selectively used in the crosslinking solution (Exemplification 2).

As opposed to these, however, when a self-polymerizing crosslinking agent is used in the crosslinking solution to form the carbon nanotube structure, then the crosslinked parts at which the carbon nanotubes in the carbon nanotube structure crosslink with each other are to have a large number of linking groups that differ in the number of the linking (polymerization) points of the molecules of the crosslinking agent and therefore a specific crosslinked structure could not be the essential structure of the crosslinked parts, irrespective of the matter as to whether single or plural functional groups are selected for carbon nanotubes and/or whether single or plural crosslinking agents are used in the crosslinking solution.

Accordingly, when a non-self-polymerizing crosslinking agent is selectively used herein, then the functional groups of carbon nanotubes may bond to each other via the residue of only one molecule of the crosslinking agent in the crosslinked parts at which the carbon nanotubes in the resulting carbon nanotube structure crosslink with each other, and therefore the crosslinked parts may have essentially the same crosslinked structure. The terminology "essentially the same" includes, as the concept thereof, not only the case where all the crosslinked parts have the same crosslinked structure as in the above "Exemplification 1", but also the other case where the crosslinked structure formed of the combination of the functional groups and the non-self-polymerizing crosslinking agent that are essentially used therein is to constitute the essential structure of all the crosslinked parts in the carbon nanotube structure, as in the above "Exemplification 2".

In "essentially the same" case, the lowermost limit of the "proportion of the same crosslinked parts" to all the crosslinked part could not be indiscriminately defined, since the crosslinked parts may have some other functional groups and crosslinked structure that differ from those for the carbon nanotube network structure formation. However, for realizing the intended, tightly-crosslinked carbon nanotube network structure that has good electric and physical properties intrinsic to carbon nanotubes, it is desirable that the "proportion of the same crosslinked parts" to all the crosslinked parts in the carbon nanotube structure is at least 50% by number, more preferably at least 70% by number, even more preferably at least 90% by number. Most preferably, all the crosslinked parts have the same structure. The proportion by number may be determined, for example, through IR spectrometry in which the intensity ratio of the absorption spectra that correspond to crosslinked structures is computed.

In that manner, the carbon nanotube structure where the crosslinked parts at which carbon nanotubes crosslink with each other have essentially the same crosslinked structure ensures the uniform carbon nanotube network structure in any desired condition, and its electric and physical properties may be kept homogeneous and good. In particular, the structure ensures the desired characteristics thereof with high reproducibility.

The skeleton of the linking group is preferably a hydrocarbon. The "hydrocarbon skeleton" as referred to herein means that the backbone part of the linking group, which acts to link the residues having remained after the crosslinking reaction of the functional groups of the carbon nanotubes to be crosslinked, is a hydrocarbon. In this, the part of the side branches where the hydrogen atom may be substituted with any other substituent is not taken into consideration. Needless-to-say, it is more desirable that the linking group is entirely formed of a hydrocarbon.

The number of the carbon atoms to constitute the hydrocarbon is preferably from 2 to 10, more preferably from 2 to 5, even more preferably 2 or 3. Not specifically defined, the linking group may be any divalent or more polyvalent group.

Preferred combinations of the functional groups that carbon nanotubes have and the crosslinking agent for them are given above. In the crosslinking reaction between the functional group —COOR (R is a substituted or unsubstituted hydrocarbon group) and ethylene glycol, the crosslinked parts at which the plural carbon nanotubes crosslink with each other have a structure of —COO(CH$_2$)$_2$OCO—.

In the crosslinking reaction between the functional group —COOR (R is a substituted or unsubstituted hydrocarbon group) and glycerin, the crosslinked parts at which the plural carbon nanotubes crosslink with each other have a structure of —COOCH$_2$CHOHCH$_2$OCO— or —COOCH$_2$CH(OCO—)CH$_2$OH when two OH groups participate in the crosslinking reaction, but have a structure of —COOCH$_2$CH(OCO—)CH$_2$OCO— when three OH groups participate in the crosslinking reaction.

As described hereinabove, in the electron beam generator device of the invention, for which the carbon nanotube structure is formed according to the above-mentioned first embodiment, the carbon nanotube structure has a network structure in which plural carbon nanotubes bond to each other via plural crosslinked parts therein. Therefore, different from those in ordinary carbon nanotube dispersion films, the crosslinked carbon nanotubes in the carbon nanotube structure of the invention are prevented from being unstable in point of their contact condition and their configuration. Accordingly, the carbon nanotube structure in the invention stably exhibits the properties intrinsic to carbon nanotubes, for example, the electric characteristics of high transmittability of electrons and holes through them, the physical characteristics of good thermal conductivity and high toughness, and other characteristics of light absorption, etc.

On the other hand, when the carbon nanotube structure is formed according to the above-mentioned second embodiment, then the crosslinking structure at which the plural carbon nanotubes crosslink with each other, or that is, those at which the functional groups of the plural carbon nanotubes bond to each other via the crosslinking reaction between them have a crosslinked structure where the residues remaining after the crosslinking reaction of the functional groups are linked to each other. Also in the carbon nanotube structure of this case, the carbon nanotubes bond to each other, like matrices, via the crosslinking part therein, and the carbon nanotube structure of the type can therefore readily exhibit the properties of the carbon nanotubes such as the high transmittance of electrons and holes through them. Specifically, in the carbon nanotube structure, the carbon nanotubes are mutually tightly connected with each other with no other binder between them. Therefore, it may be said that the carbon nanotube structure of the type is composed of substantially carbon nanotubes only therein.

In addition, since the functional groups are directly reacted with each other to form the crosslinked parts in the carbon nanotube structure of the type, the substantial density of the carbon nanotubes in the structure can be increased. Further, when the size of the functional groups is reduced, then the distance between the crosslinked carbon nanotubes may be narrowed so that they are electrically and physically extremely near to each other. In that condition, the carbon nanotube structure may more favorably enjoy the properties of the constitutive carbon nanotubes.

In addition, since the crosslinked parts are in the form of chemical bonding of the functional groups to each other, the structure may have essentially the same crosslinked structure, therefore ensuring the uniform carbon nanotube network structure in any desired condition, and its electric and physical properties may be kept homogeneous and good. In particular, the structure ensures the desired characteristics thereof with high reproducibility.

The electron beam generator device of the invention may have any other layers than the layer of the carbon nanotube structure mentioned above. For example, an adhesive layer may be provided between the base body surface and the carbon nanotube structure layer for increasing the adhesiveness of the two. This is favorable as enhancing the adhesion strength of the carbon nanotube structure layer. In addition, an insulator or a conductor may be applied to the outer periphery of the carbon nanotube structure, depending on the use of the electron beam generator device. The method for forming the adhesive layer and other details are described in the section of "method for producing electron beam generator device" given hereinunder.

Concrete shapes of the electron beam generator device of the invention described hereinabove will be clarified in the next section of "method for producing electron beam generator device" and in the section of Examples to be given hereinunder. Needless-to-say, the constitution to be described below is only for exemplification, and concrete embodiments of the electron beam generator device of the invention should not be limited thereto.

[Method for Producing Electron Beam Generator Device]

The method for producing electron beam generator devices of the invention (this may be hereinafter referred to as "production method of the invention") is a method suitable for producing the electron beam generator device of the invention mentioned above. Concretely, the method comprises at least (A) a supply step of applying plural carbon nanotubes having functional groups to the conductive surface of a base body, and (B) a crosslinking step of chemically bonding the functional groups to each other to form crosslinked parts, thereby forming a carbon nanotube structure to constitute a network structure of the plural carbon nanotubes mutually electrically connected to each other.

These steps are described in detail hereinunder.

(A) Supply Step

In the invention, the "supply step" is for applying at least plural carbon nanotubes having functional groups to the conductive surface of a base body. In this, the crosslinking solution mentioned hereinabove may be used. Simply, it may be applied to the surface of a base body. The coating method is simple and inexpensive, and gives a layer to form the intended carbon nanotube structure within a short period of time.

Not specifically defined, the coating method broadly includes from a method of merely applying liquid drops onto a base body followed by spreading them with a squeeze to any other ordinary coating method. For example, herein employable are ordinary coating methods of spin coating, wire bar coating, casting, roll coating, brushing, dipping, spraying, curtain coating, etc. When an electron beam generator device as the electron gun for electron microscopes is to be produced, as in FIG. 1, the tapered tip of a base body may be dipped in the above-mentioned crosslinking solution.

For the details of the base body having a conductive surface, the carbon nanotubes having functional groups, the crosslinking agent, the additive and the crosslinking solution to be employed in this section, referred to are those described in the section of "electron beam generator device" given hereinabove.

(B) Crosslinking Step

In the invention, the "crosslinking step" is for chemically bonding the functional groups of the carbon nanotubes having been applied to the base body, to each other to form crosslinked parts, thereby forming the carbon nanotube structure. When the crosslinking solution is applied to the base body in the supply step, then it is cured to form the intended carbon nanotube structure where the plural carbon nanotubes are mutually crosslinked with each other to constitute a network structure thereof.

The operation in the crosslinking step shall be naturally determined depending on the combination of the functional groups and the crosslinking agent. For example, it is as in Table 1 give hereinabove. The thermosetting combination may be heated with a heater; and the UV-curable combination may be irradiated with a UV lamp or may be left under sunlight. Needless-to-say, the spontaneously curable combination may be left as such (shelf storage). The "shelf storage" is one type of operation to be effected in the crosslinking step in the invention.

The combination of carbon nanotubes with a functional group —COOR (R is a substituted or unsubstituted hydrocarbon group) added thereto, and a polyol (especially glycerin and/or ethylene glycol) may be cured under heat (for polyesterification through interesterification). When heated, —COOR of the carbon nanotube-carboxylate undergoes interesterification with R' —OH of the polyol (R' is a substituted or unsubstituted hydrocarbon group). The reaction occurs many times repeatedly and multi-dimensionally whereby the carbon nanotubes are crosslinked with each other to finally form a networked carbon nanotube structure where the carbon nanotubes are mutually connected with each other.

Preferred conditions for the combination are mentioned. Concretely, the heating temperature preferably falls between 50 and 500° C., more preferably between 120 and 200 C. The heating time for the combination is preferably between 1 minute and 10 hours, more preferably between 1 and 2 hours.

(C) Other Steps

The two steps give the carbon nanotube structure mentioned above, and produce the electron beam generator device of the invention. The method for producing the electron beam generator device of the invention may include any other steps than these.

For example, prior to the supply step (especially for coating), the method preferably includes a surface treatment step of pre-treating the surface of the base body. The surface treatment step is, for example, for increasing the adsorbability of the base body to receive the crosslinking solution supplied (applied) thereto, or for increasing the adhesiveness between the base body surface and the carbon nanotube structure to be formed thereon as an upper layer, or for cleaning the base body surface, or for controlling the electroconductivity of the base body surface.

The surface treatment step to be attained for increasing the adsorbability of the base body to receive the crosslinking solution applied thereto includes, for example, treatment with a silane-coupling agent (e.g., aminopropyltriethoxysilane, γ-(2-aminoethyl)aminopropyltrimethoxysilane). In particular, surface treatment with aminopropyltriethoxysilane is widely carried out in the art, and it is favorable for the surface treatment step in the invention. Surface treatment with aminopropyltriethoxysilane has heretofore been employed for surface treatment of mica that is used for base bodys in AFM observation of DNA, for example, as in Y. L. Lyubchenko et al., *Nucleic Acids Research,* 1993, Vol. 21, pp. 1117-1123.

When two or more layers of carbon nanotube structure are laminated, then the operation of the method for producing the electron beam generator device of the invention as above may be repeated twice or more.

When any other additional layers such as protective layer and electrode layer are separately laminated, then they require addition steps for forming them. For forming these layers, materials and methods may be selected from those heretofore known in the art, in accordance with their object; or substances or methods newly developed for the invention may be employed for forming them.

[Second Production Method]

Of the electron beam generator devices of the invention, those in which the carbon nanotube structure comprises the crosslinked carbon nanotubes and additionally aliphatic polyketone polymers that are crosslinked with each other via other functional groups than the functional groups assimilated into the crosslinked parts therein and are compounded with the crosslinked carbon nanotubes to form a network structure complex along with the carbon nanotube structure are produced according to a second production method. The second production method of the invention comprises a supply step and a crosslinking step, which are described in detail hereinunder.

(A) Supply Step

The supply step in the second production method is for applying at least a polyalcohol and plural carbon nanotubes having functional groups capable of polymerizing with the polyalcohol, to the conductive surface of a base body.

The starting material, polyalcohol preferably has a secondary alcohol and a primary alcohol in one molecule. The polyalcohol of the type includes, for example, glycerin, 1,3,5-trihydroxypentane, 1,2,4-trihydroxybutane, 1,2,6-trihydroxyhexane. In particular, glycerin is preferred as it is inexpensive and its load on the environment is small, and in addition, it readily undergoes polymerization with a dehydration and oxidation catalyst.

In polyether-ketone polymers, in general, the ketone group improves the polymer hardness and the ether group improves the polymer flexibility. Accordingly, the mechanical properties of the polymers such as the polymer hardness can be controlled by controlling the number of these groups in the polymers. Specifically, when the proportion of the ether bond in the polymer is increased, then the polymer flexibility increases; but on the contrary, when the proportion of the ketone group therein is increased, then the polymer hardness increases.

In the second production method of the invention, however, the ketone group is derived from the starting material, polyalcohol. When a mixture with a diol compound (e.g., ethylene glycol) is used as the starting material, polyalcohol, and polymerized, then the diol compound therein gives only ether bond, and therefore the proportion of the ether bond in the resulting polymer molecules increases. Accordingly, when the blend ratio of the polyalcohol to the diol compound in the mixture is varied, then the polymer flexibility may be controlled.

The starting material, carbon nanotubes may be the same as those mentioned hereinabove, and their preferred examples may also be the same as above. Accordingly, their detailed description is herein omitted.

The carbon nanotubes for use in the second production methods must be modified with functional groups that polymerize with the polyalcohol mentioned above. The functional groups include —COOR, —COX and —NCO (R is a substituted or unsubstituted hydrocarbon group, and X is a halogen atom). When —COOH that may relatively readily modify carbon nanotubes is selected, then it is favorable since the intended complex structures are easy to form.

(B) Crosslinking Step

The crosslinking step in the second production method is for chemically bonding the polyalcohol and the functional groups that the carbon nanotubes have, separately or together to each other in the presence of a catalyst for polymerization, thereby forming a network structure complex that comprises a carbon nanotube structure to constitute a network structure of the plural carbon nanotubes mutually electrically connected to each other, and aliphatic polyketone polymers that are crosslinked via other functional groups than the functional groups assimilated into the crosslinked parts and are compounded to the carbon nanotubes in the carbon nanotube structure.

The step includes polymerization with oxidation to give a composition that contains an aliphatic polyketone polymer or includes polymerization with dehydration to give a composition that contains an aliphatic polyether-ketone polymer. The catalyst to cause the reaction may be selected from sulfuric acid, nitric acid, aqueous hydrogen peroxide, $Na_2Cr_2O_7$, $CrO_3Cl$, and NaOCl. In particular, sulfuric acid is preferred for the catalyst since it may induce efficient dehydration and oxidation and since it is inexpensive and is easy to handle.

The amount of the catalyst to be used (to be added to the system) is preferably from 0.1 mg to 100 mg per gram of the starting material, polyalcohol, more preferably from 0.5 mg to 80 mg, even more preferably from 5 mg to 50 mg. If the amount of the catalyst is too small, then the polymerization maybe difficult to occur; but if too large, the resulting polymer (composition) may foam.

The polymerization reaction of polyalcohol is described below with reference to some examples thereof.

Concretely, when a polyalcohol, glycerin is polymerized with a diol compound, then the polyalcohol alternately polymerizes with the diol compound to give polyether-ketone as in the following reaction formula:

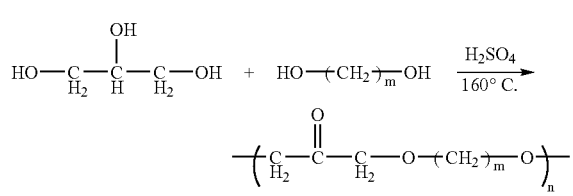

A polymer of plural glycerin molecules as the polyalcohol, and plural diol compounds give a block copolymer of polyether-ketone and polyether (block copolymer comprising the structural units of formula (1) mentioned below and the structural units of formula (4) mentioned below).

Preferably, the polymerization in this step may leave OH group in the resulting polymer. This embodiment may give an aliphatic polyketone polymer having the structural units of formula (5) mentioned below, which is a gel substance having stable solubility in water.

Concretely, for example, when nitric acid is used as the catalyst, then its boiling point is 120° C. In this case, therefore, when the system is heated at a temperature not lower than 120° C. so that the catalyst, nitric acid is removed before the starting material (e.g., glycerin and diol) has been completely polymerized, then all the OH groups in the starting material are not completely reacted to give ketone group and a gel-like polymer (polymer gel) with —OH group partially remaining therein may be obtained.

In this, the gel substance (polymer gel) is viscous and is poorly flowable when used for coating or shaping, and therefore it is favorable for producing films and shaped structures. When sulfuric acid is added to the polymer gel and applied onto base bodys or shaped into articles, then a cured polymer may be formed after heated, for example, at 150° C. or so.

The system that contains the catalyst is preferably heated for efficient polymerization thereof. The heating method is not specifically defined, but electromagnetic heating is preferred as inducing efficient polymerization.

One concrete example of the operation of this step is described below. The reaction mechanism of this process is given below. For example, when glycerin is used as the starting material and sulfuric acid as the dehydration catalyst, then the system undergoes dehydration condensation at the primary alcohol and oxidation at the secondary alcohol. The dehydration condensation is to remove one $H_2O$ molecule from two glycerin molecules at the primary alcohol site thereof by the dehydration action of sulfuric acid, and an ether bond is thereby formed. The oxidation reaction is to remove two hydrogen atoms from the secondary alcohol site, H—C—OH, and a ketone group is thereby formed. The product in the process is an aliphatic polyether-ketone. In this, unreacted OH group may remain in the product, as mentioned hereinabove. Further, the OH group may be chemically modified with a molecule having a functional group capable of reacting with OH. In addition, the primary alcohol site and the secondary alcohol site may together undergo dehydration condensation, and the secondary alcohol site alone may undergo dehydration condensation.

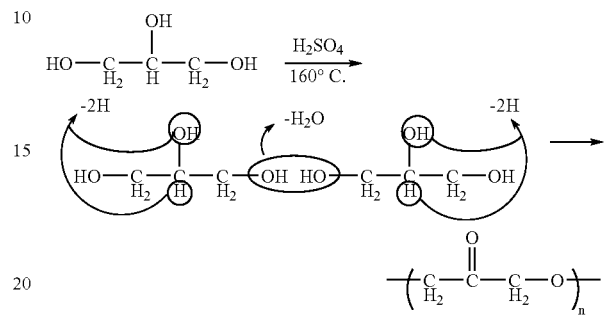

As in the above, the part of aliphatic polyketone polymer usable in the invention may be formed from the starting material that is easy to handle.

Aliphatic polyketone polymers usable in the invention may be produced according to the production method mentioned above. Of those, polyether-ketone polymers are more preferred for use in the invention, and these are described below.

Aliphatic polyether-ketone polymers have, as the basic skeleton thereof, structural units of formula (1) mentioned below, and these have no aromatic ring. The aliphatic polyether-ketone polymer has both a ketone group having the ability to cure the polymer and an ether bond having the ability to soften the polymer. Therefore, when the number of these groups in the polymer is specifically controlled, then it is possible to control the mechanical properties of the polymer such as the hardness thereof while the thermal stability of the polymer is kept as such. Accordingly, the polymer of the type is useful as a material typically for engineering plastics.

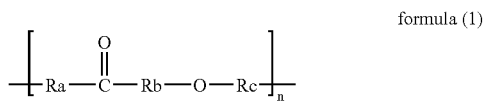

formula (1)

In formula (1), Ra and Rb each independently represens a substituted or unsubstituted divalent aliphatic hydrocarbon group; Rc represents an ether bond-terminated, substituted or unsubstituted divalent aliphatic hydrocarbon group, or represents a single bond; and n indicates an integer of from 2 to 10000. In the polymer of formula (1), the ketone group moiety C=O may be partially substituted with a hydroxyl group moiety CHOH (as in formula (5)). If desired, the polymer may form a block copolymer with any other polymer.

The divalent aliphatic hydrocarbon group may have from 1 to 20 carbon atoms, and it may be linear, branched or cyclic. Preferably, the group is a linear aliphatic hydrocarbon group. Concretely, for example, it is an alkyl chain having from 1 to 20 carbon atoms. The ether bond-terminated, divalent aliphatic hydrocarbon group may be the aliphatic hydrocarbon group as above, having an ether bond (—O—) at its terminal.

The substituent for the divalent aliphatic hydrocarbon group includes, for example, —COOR, —COX, —MgX, —X, —OR, —NR$^1$R$^2$, —NCO, —NCS, —COOH, —OH, —O, —NH$_2$, —SH, —SO$_3$H, —R'CHOH, —CHO, —CN, —COSH, —SR, —SiR'$_3$. In these, X represents a halogen atom, and R, R$^1$, R$^2$ and R' each independently represents a substituted or unsubstituted hydrocarbon group.

Ra and Rb each are a substituted or unsubstituted divalent aliphatic hydrocarbon group. Concretely, the group includes —CH$_2$—, —CHNH$_2$—, —C(NH$_2$)$_2$—, —CHCN—, —C(CN)$_2$—, —CHOH—, —C(OH)$_2$, —CO—, —CHSH—, —C(SH)$_2$—, —CHCOOH—, —C(COOH)$_2$—, —CHX—, and —CX$_2$—. The repetition and combination of these are also within the scope of the group. In these, X represents a halogen atom.

Examples of Rc are a single bond, and an ether bond-terminated, substituted or unsubstituted divalent aliphatic hydrocarbon group represented by -Rc'-O—, in which Rc' includes, for example, —CH$_2$—, —CHNH$_2$—, —C(NH$_2$)$_2$—, —CHCN—, —C(CN)$_2$—, —CHOH—, —C(OH)$_2$—, —CHSH—, —C(SH)$_2$—, —CHCOOH—, —C(COOH)$_2$—, —CHX—, and —CX$_2$—. The repetition and combination of these Rc's are also within the scope of the group. In addition, the repetition of -Rc'-O—, and a combination of -Rc'-O— structures in which Rc' differs between them are also within the scope of the group. In these, X represents a halogen atom.

Concretely, the structural units of formula (1) may be those of the following structural formula (2) for polyether-ketone polymers when glycerin is used for the starting polyalcohol. In formula (2), n indicates an integer of from 2 to 10000.

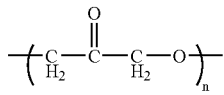

structural formula (2)

When the starting material, polyalcohol is a combination of glycerin and ethylene glycol, then it gives polyether-ether-ketone polymers having structural units of the following structural formula (3), in which m indicates an integer of from 1 to 20 and n indicates an integer of from 2 to 10000.

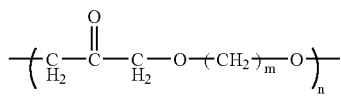

structural formula (3)

Polyketone polymers having structural units of the following structural formulae, as those of formula (1), are still other examples of the polymers for use in the invention. In the following formulae, m1, m2 and m3 each independently indicate an integer of from 1 to 20, and n indicates an integer of from 2 to 10000.

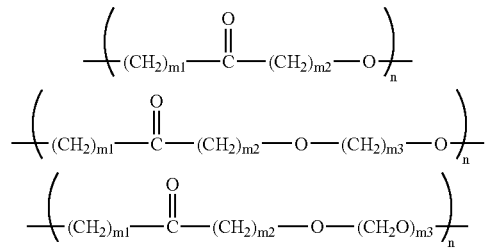

The terminal group of the aliphatic polyether-ketone polymers may be selected from a group consisting of —OH, —COOH, —COOR (R is a substituted or unsubstituted hydrocarbon group), —COX (X is a halogen atom), —NH$_2$ and —NCO.

The aliphatic polyether-ketone polymers preferably have a mass-average molecular weight of from 84 to 1,000,000, more preferably from 500 to 500,000, even more preferably from 1,000 to 100,000.

In the aliphatic polyether-ketone polymers, the ratio of the ether bond to the ketone group (ether bond/ketone group) preferably falls between 0.01 and 100, more preferably between 0.04 and 25.

In these, in general, the ketone group improves the polymer hardness and the ether group improves the polymer flexibility, as will be described hereinunder. Accordingly, the mechanical strength of the polymers can be controlled by controlling the number of the ketone groups and the number of the ether groups.

As in the above, aliphatic polyketone polymers having the structural units of formula (1) in the polymer chain thereof can be produced from the starting material, polyalcohol. The polymers may have the same structural units of formula (1) as the repetitive structural units, or may have different structural units of formula (1) that differ in Ra, Rb and/or Rc therein.

In addition, they may be copolymers comprising the structural units of formula (1) and other structural units (not containing an aromatic group).

Concretely, the polymers include those composed of the structural units of formula (1) and polyethers of the following formula (4); and block copolymers comprising them as the constitutive elements thereof (block copolymers comprising polyether-ketone segments and polyether segments). More concretely, the block copolymers comprise polyether-ketones of structural units of the structural formula (2) and polyethers. In the polymers comprising the units of formulae (1) and (4), n, k and l each independently indicate an integer of 1 or more; k indicates an integer of from 1 to 20; n indicates an integer of from 1 to 5000; and l indicates an integer of from 1 to 5000. In formula (4), R$_1$ and R$_2$ each independently represent H or an alkyl group. In these polymers, a part of the structural units of formula (1) may be substituted with those of the following formula (5) where OH still remains as such therein.

formula (4)

The aliphatic polyether-ketone polymers may be produced to have a crosslinked structure. When having a crosslinked structure of a combination of ketone group and ether bond, the polymers may be more stabilized both mechanically and thermally. For example, the structural units of formula (1) may be crosslinked with glycerin or aliphatic diol to form crosslinked polymers. Concretely, the structural units of formula (2) are crosslinked with glycerin or aliphatic diol compound to give crosslinked polymers having the following structure:

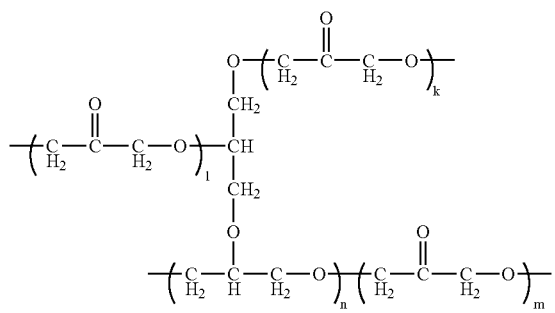

When containing substantially no OH group, the aliphatic polyketone polymers are extremely stable in point of their chemical properties. On the other hand, when containing OH, they form water-soluble gel polymers (polymer gel). The gel polymers are viscous and are poorly flowable when used for coating or shaping, and therefore they are favorable for producing films and shaped structures. After they are applied onto base bodys or shaped, they are heated, whereby they are simply cured into desired shapes or are formed into polymer compositions having a crosslinked structure. In the polymers, the OH group may be modified with a molecule having a functional group capable of reacting with OH.

The OH group may remain in the structural units of formula (1) not completely converted into ketone group while the polymers are produced. In other words, the aliphatic polyether-ketone polymers may have structural units of the following formula (5) in the chains that constitute the polymers. Since the polymers have the OH group remaining therein without being converted into ketone group while they are produced, the structural units of formula (1) to constitute the polymers are partially substituted with those of formula (5).

formula (5)

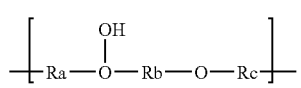

In formula (5), Ra and Rb each independently represent a substituted or unsubstituted divalent aliphatic hydrocarbon group; Rc represents an ether bond-terminated, substituted or unsubstituted divalent aliphatic hydrocarbon group, or represents a single bond. Ra, Rb and Rc in formula (5) have the same meanings as Ra, Rb and Rc in formula (1).

OH group may exist in both the structural units of formula (1) and the other structural units to constitute block copolymers. Concretely, for example, the polyether segments in the block copolymers that comprise polyether ketones of the structural units of formula (2), and polyethers (block copolymers comprising structural units of formula (1) and structural units of formula (4)) may have OH group, as in the following structural formula:

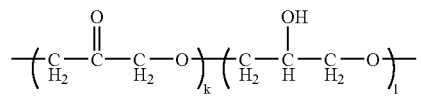

In this crosslinking step, when the starting material is the polyalcohol alone for polymerization, then aliphatic polyketone polymers are produced as in the above. However, in the second production method of the invention, the plural carbon nanotubes that have functional groups capable of polymerizing with the polyalcohol also participate in the reaction, and, in fact, there occur various crosslinking reactions between the polyalcohol and the functional groups of the carbon nanotubes, and between the functional groups of the carbon nanotubes to thereby give composites of the resulting carbon nanotube structure and aliphatic polyketone polymer.

For example, carbon nanotubes with functional groups of —COOH or the like added thereto are dispersed in the starting material, polyalcohol (e.g., glycerin) for polymerization in the crosslinking step, and a catalyst (e.g., sulfuric acid) is added thereto. In that condition, the polymerization is started according to the method mentioned above, and it gives a composite having the resulting carbon nanotube structure filled with carbon nanotubes at high density.

The bonding sites at which the plural carbon nanotubes and the polymer molecules mutually bond to each other are COOCH$_2$CHOHCH$_2$OCO— or —COOCH$_2$CH(OCO—)CH$_2$OH, when the functional group is —COOR (R is a substituted or unsubstituted hydrocarbon group) and when the polymer material is glycerin and its two OH groups participate in the chemical bonding to the carbon nanotubes; and are —COOCH$_2$CH(OCO—)CH$_2$OCO— when the three OH groups of the polymer participate in the crosslinking reaction. The chemical structure of the crosslinked parts may be any one selected from the group of the above-mentioned two.

As in the above, the second production method of the invention forms a composite network structure comprising a carbon nanotube structure and an aliphatic polyketone polymer structure, on the surface of a base body. The electron beam generator device comprising the composite structure has the excellent electric characteristics derived from carbon nanotubes such as the efficient electron beam emission characteristics as above, and has high mechanical strength and good heat resistance derived from the engineering plastic, aliphatic polyketone polymer. Accordingly, this embodiment of the invention provides electron beam generator devices of high durability, and it is especially favorable for providing electron beam generator devices that may be exposed to high heat (e.g., thermoelectric emission-type electron guns).

According to the second production method of the invention, the electron beam generator devices having the above-mentioned excellent characteristics can be produced without using petroleum for the starting material. Because of its advantages that its reaction process is simple, its load on the environment is low and it uses polyalcohol that is easy to handle as compared with petroleum material, the production method is suitable to industrial-scale production of the devices.

[Use Example of Electron Beam Generator Device]

The electron beam generator device of the invention can be used for electron emission, for example, as electron sources (electron guns) of electron microscopes, and cathode electrodes of FED (field-emission displays).

(Electron Gun of Electron Microscope)

For example, the electron beam generator device of the embodiment of FIG. 1 and FIG. 2 can be used as the electron source (electron gun) of electron microscopes.

Figure 3:
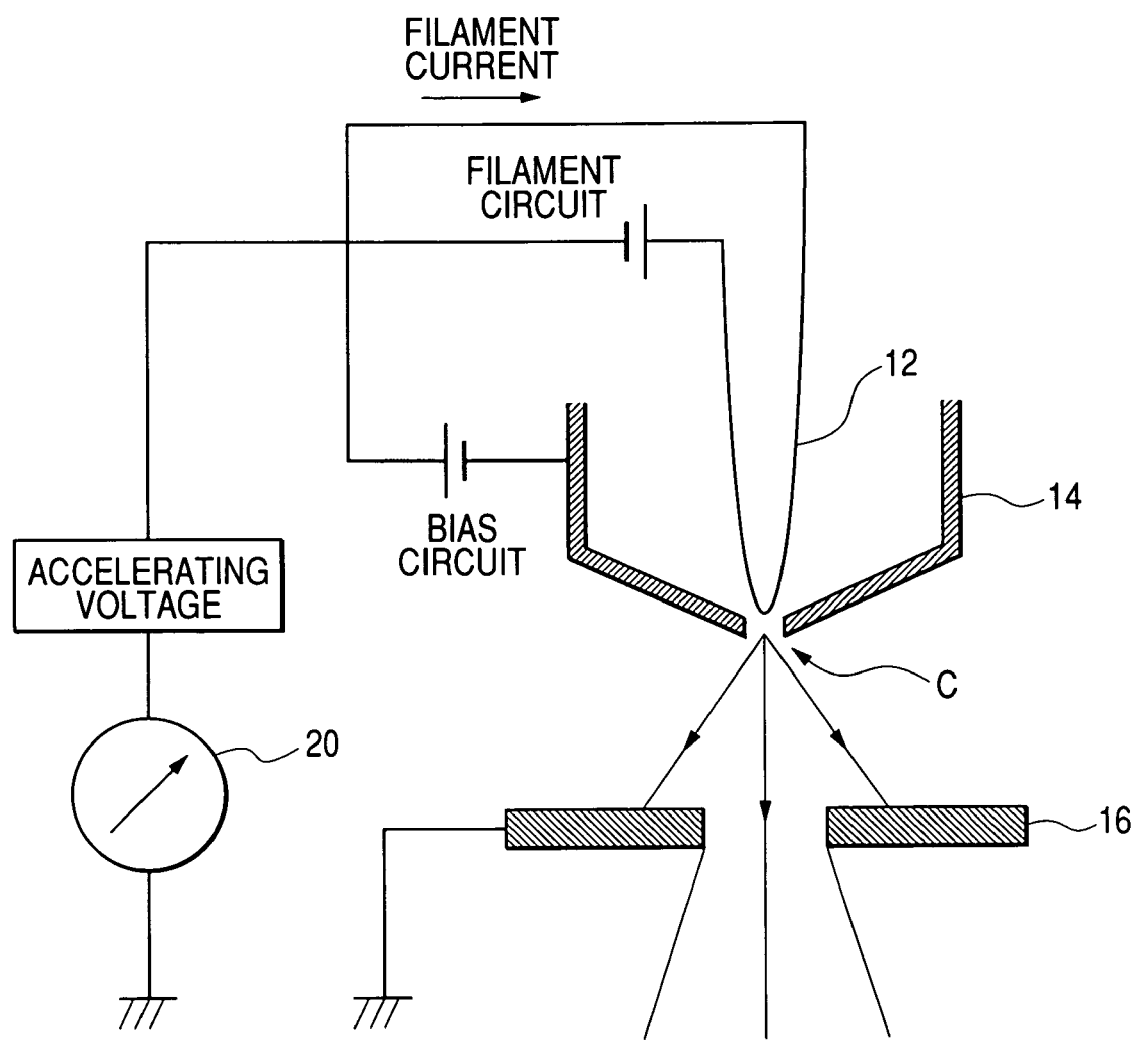
FIG. 3 is an outline view of a thermal emission-type electron gun for electron microscopes, to which the electron beam generator device of the invention is applicable.

FIG. 3 is an outline view of a thermal emission-type electron gun of electron microscopes, to which the electron beam generator device of the invention is applicable. The electron gun of this embodiment emits electron beams from the filament 12 that serves as a thermal emission cathode therein, and the electron beam generator device of the invention is applicable to the filament 12.

The anode 16 is at a ground potential, and a minus voltage is applied to the filament 12. This potential corresponds to accelerating voltage. A minus voltage that is somewhat lower than that applied to the filament 12 is applied to the Wehnelt 14, and this is referred to as a bias voltage. Having the constitution, the electron gun functions as follows: The filament 12 emits electrons, and they undergo orbital correction by the electric field formed by the bias voltage applied to the Wehnelt 14, then once converge just below the Wehnelt (this is referred to as a crossover point, and this is dealt with as a substantial light source—the arrow C in the drawing), and are thereafter accelerated toward the anode 16 by the electric field formed by the accelerating voltage.

Figure 4A:
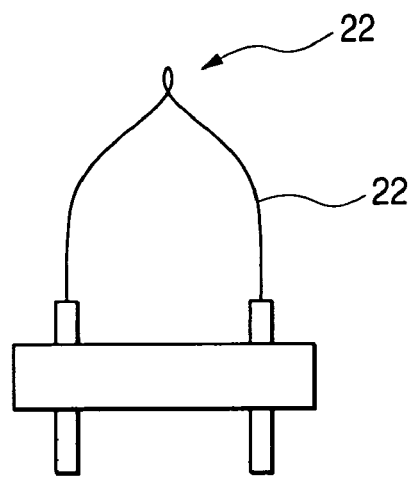
FIG. 4A to 4C show graphical views of ordinary filaments that are applicable to the electron gun of FIG. 3.
Figure 4B:
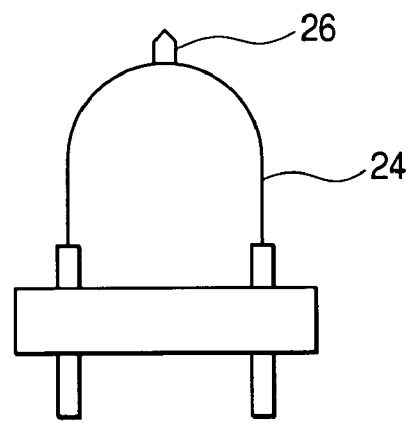
Figure 4C:
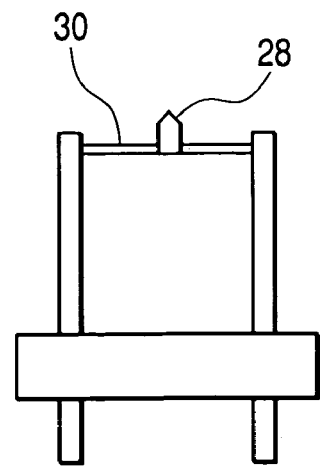

For the filament 12 that serves as such a thermal emission cathode, generally used are tungsten hairpin filament, point filament, $LaB_6$, etc. FIG. 4A to 4C show outlines of these ordinary filaments. The tungsten hairpin filament of FIG. 4A is designed as follows: The tip of the tungsten filament 22 is twisted like a hairpin to form a looped tip, and the thus-looped tip serves as an electron beam generation source. The point filament of FIG. 4B is designed as follows: A tungsten chip 26 is fitted to the tip of the tungsten filament 24, and this serves as an electron beam generation source. The $LaB_6$ filament of FIG. 4C is designed as follows: An $LaB_6$ chip 28 is fitted to the conductive base body 30, and this serves as an electron beam generation source.

In all these types, the above-mentioned crosslinking solution is applied onto the site to be the electron beam generation source, and cured thereon, and the electron beam generator device of the invention can be produced in such a simple manner.

Figure 5:
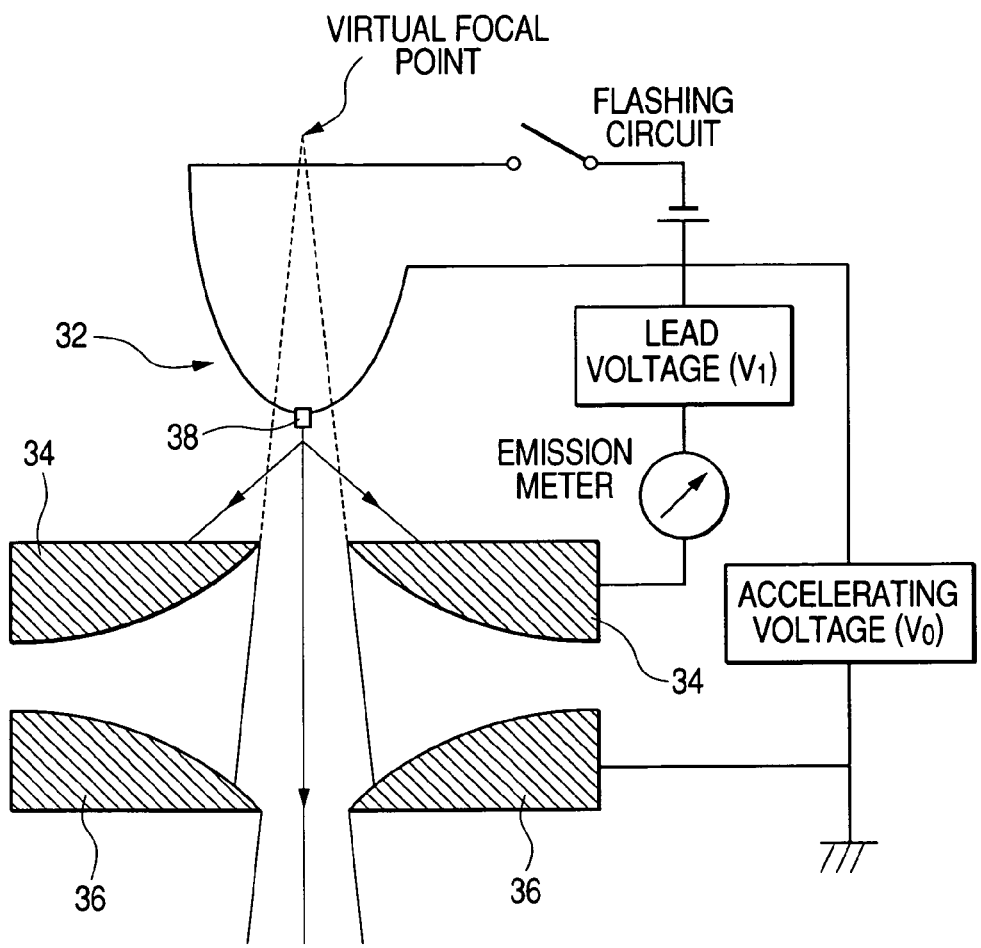
FIG. 5 is an outline view of a field emission-type electron gun for electron microscopes, to which the electron beam generator device of the invention is applicable.

FIG. 5 is an outline view of a field-emission electron gun for electron microscopes to which the electron beam generator device of the invention is applicable. In the electron gun of this embodiment, the filament 32 serves as a field-emission cathode and emits electron beams, and the electron beam generator device of the invention may be applied to the filament 32.

An FE chip 38 is fitted to the tip of the filament 32. The FE chip is a member that emits electrons in a strong electric field, and tungsten single crystal or the like is used as the material for it. The above-mentioned crosslinking solution is applied onto the tip of the FE chip 38 and cured thereon, and the electron beam generator device of the invention can be produced in such a simple manner.

This embodiment comprises two anodes, first anode 34 and second anode 36. The first anode 34 functions to take a lead electrode $V_1$ to produce a strong electric field around the tip of the FE chip 38. The second anode 36 functions to take an accelerating voltage $V_0$ to accelerate the electrons emitted by the FE chip 38. The size of the light source of the electron gun of this embodiment is only a few nm and is much smaller than that of ordinary thermal emission-type electron guns, but its brightness is higher by about 1,000 times than thermal emission guns. Having these two advantages, the electron gun of the this embodiment significantly improves the resolution power of scanning electron microscopes (SEM). In particular, field-emission electron guns are indispensable for obtaining high resolution in a low accelerating voltage region.

(FED)

Figure 6:
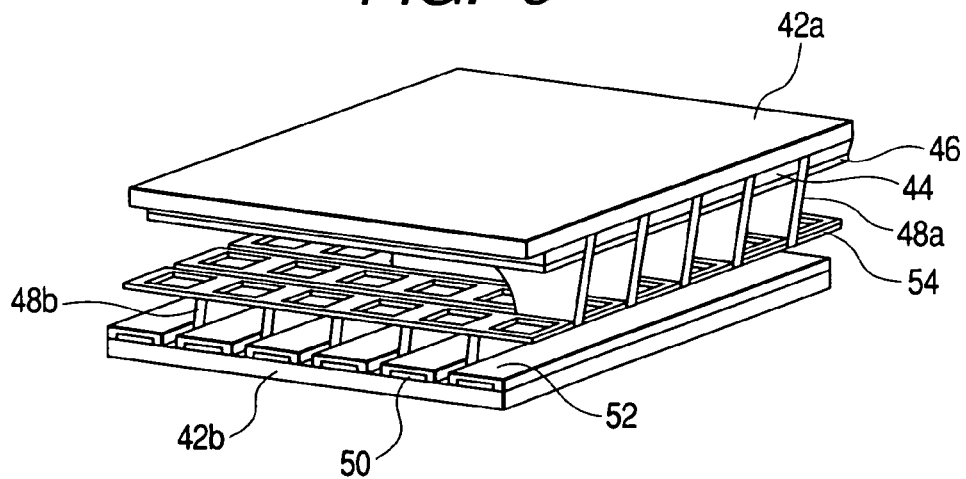
FIG. 6 is an outline perspective view of FED to which the electron beam generator device of the invention is applicable.

FIG. 6 is a perspective view of FED to which the electron beam generator device of the invention is applicable. FED of this embodiment comprises an image-forming structure sandwiched between two glass sheets 42a and 42b. More concretely, a cathode electrode 50 that serves as an electron beam generator device is formed on the surface of the glass sheet 42b; a carbon nanotube structure film 52 is formed on the surface of the electrode 50; and a grid 54 to constitute a gate electrode, which is to form pixels and is to lead electrons, is supported on it by supports 48b. Additional support 48a are disposed on the grid 54, and these support the glass sheet 42a that is opposite to the glass sheet 42a. On the surface of the glass sheet 42a that faces the glass sheet 42b, an aluminium film 46 to form an anode electrode is fitted so as to sandwich the fluorescent layer 44 for RGB emission, between them.

The electron beam generator device that comprises the cathode electrode 50 and the carbon nanotube structure film 52 emits electrons in an electric field. This may control the current release from it, depending on the voltage applied thereto. The grid (gate electrode) 54 takes a lead electrode applied thereto, and leads out electrons. An accelerating voltage is applied to the aluminium film 46 that forms an anode electrode, and this accelerates the generated electrons. With that, the fluorescent layer 44 emits light owing to the thus-accelerated electrons. According to the process as above, FED of this embodiment forms an image on the surface of the glass sheet 42a.

The electron beam generator device of the invention is applicable to the electron beam generator device that comprises the cathode electrode 50 and the carbon nanotube structure film 52 in the FED assembly as above. Concretely, the cathode electrode 50 corresponds to the "conductive surface-having base body" in the invention; and the carbon nanotube structure film 52 formed on it corresponds to the carbon nanotube structure in the invention. Thus designed, the electron beam generator device of this embodiment is the electron beam generator device of the invention.

As in the above, the electron beam generator device of the invention is not specifically defined in point of its shape, or that is, it may be tabular or may have any other shape so far as it satisfies the constitutive elements of the invention and it is for generating electron beams.

EXAMPLES

The invention is described more concretely with reference to the following Examples, to which, however, the invention should not be limited.

Example 1

An electron beam generator device was produced according to the production method mentioned hereinabove.

(A) Supply Step (A-1) Preparation of Crosslinking Solution (Addition Step)

Figure 7:
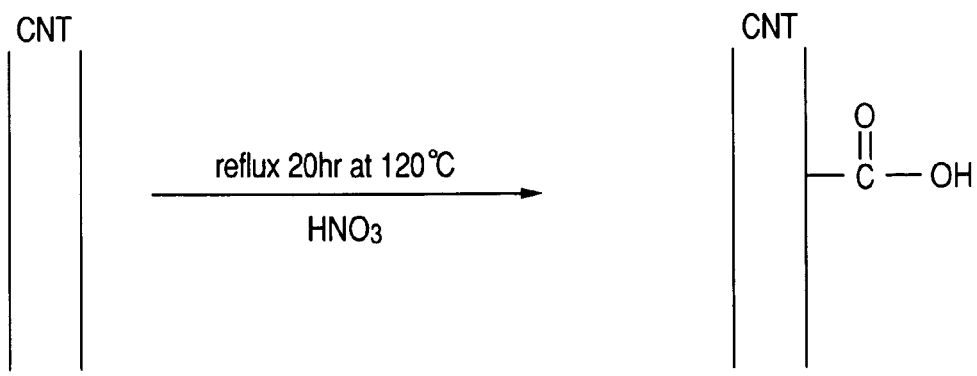
FIG. 7 is a reaction scheme of producing a carbon nanotube-carboxylic acid in the (addition step) in Example 1.

(i) Addition of Carboxyl Group—Production of Carbon Nanotube-Carboxylic Acid 30 mg of multi-walled carbon nanotube powder (purity 90%, mean diameter 30 nm, mean length 3 μm; from Science Laboratory) was added to 20 ml of concentrated nitric acid (aqueous 60 mas. % solution, from Kanto Chemical), and refluxed at 120° C. for 20 hours to produce a carbon nanotube-carboxylic acid. The reaction scheme is in FIG. 7. In FIG. 7, the part of carbon nanotube (CNT) is indicated by two parallel lines (the same shall apply to the other drawings of reaction schemes).

The solution was restored to room temperature, and centrifuged at 5000 rpm for 15 minutes to separate the precipitate from the supernatant. The collected precipitate was dispersed in 10 ml of pure water, and again centrifuged at 5000 rpm for 15 minutes to separate the precipitate from the supernatant (this is one washing operation). The washing operation was repeated additionally five times, and the precipitate was finally collected.

The thus-collected precipitate was analyzed through IR absorption spectrometry. For comparison, the starting material, multi-walled carbon nanotube powder was also analyzed through IR absorption spectrometry. The two spectra were compared with each other; and an absorption peak characteristic of carboxylic acid was seen at 1735 $cm^{-1}$ only in the chart of the precipitate, but not in the chart of the starting material, multi-walled carbon nanotube powder. This confirms the introduction of carboxyl group into the carbon nanotubes through reaction thereof with nitric acid. In other words, this confirms that the precipitate is a carbon nanotube-carboxylic acid.

The collected precipitate was added to neutral pure water, and its dispersion was good. This supports the result of the IR absorption spectrometry that confirms the introduction of hydrophilic carboxyl group into carbon nanotubes.

Figure 8:
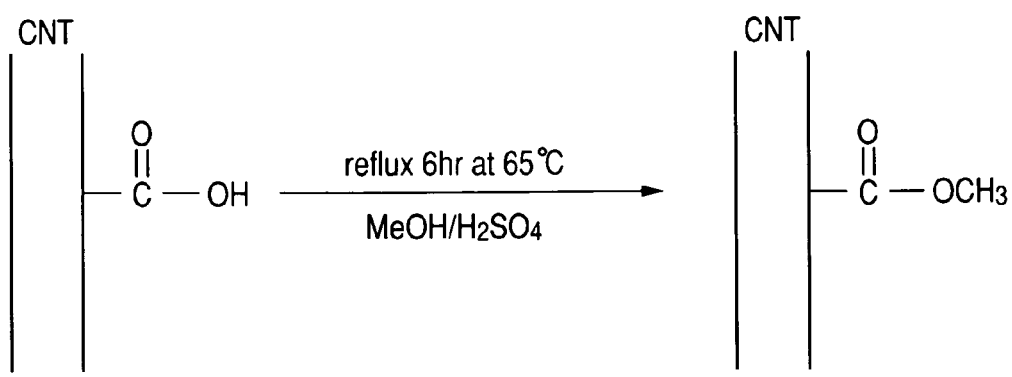
FIG. 8 is a reaction scheme of esterification in the (addition step) in Example 1.

(ii) Esterification 30 mg of the carbon nanotube-carboxylic acid prepared in the above step was added to 25 ml of methanol (from Wako Pure Chemicals), and then 5 ml of concentrated sulfuric acid (98 mas. %, from Wako Pure Chemicals) was added to it and refluxed at 65° C. for 6 hours whereby the carboxylic acid was methyl-esterified. The reaction scheme is in FIG. 8.

The solution was restored to room temperature, and filtered to separate the precipitate. The precipitate was washed with water and then collected. The thus-collected precipitate was analyzed through IR absorption spectrometry. As a result, absorption peaks characteristic of the ester were seen at 1735 $cm^{-1}$ and in a region of 1000 to 1300 $cm^{-1}$, and this confirms the esterification of the carbon nanotube-carboxylic acid.

(Mixing Step)

30 mg of the carbon nanotube-carboxylic acid that had been methyl-esterified in the above step was added to 4 g of glycerin (from Kanto Chemical), and mixed with an ultrasonic disperser. Further, this was added to 4 g of methanol serving as a viscosity improver to prepare a crosslinking solution (1).

(A-2) Supply (Coating) Step

The tip of a tungsten filament having a shape of FIG. 4A was dipped in the crosslinking solution (1 μl) prepared in the step (A-1), whereby the tip of the filament was coated with the crosslinking solution.

(B) Crosslinking Step

Figure 9:
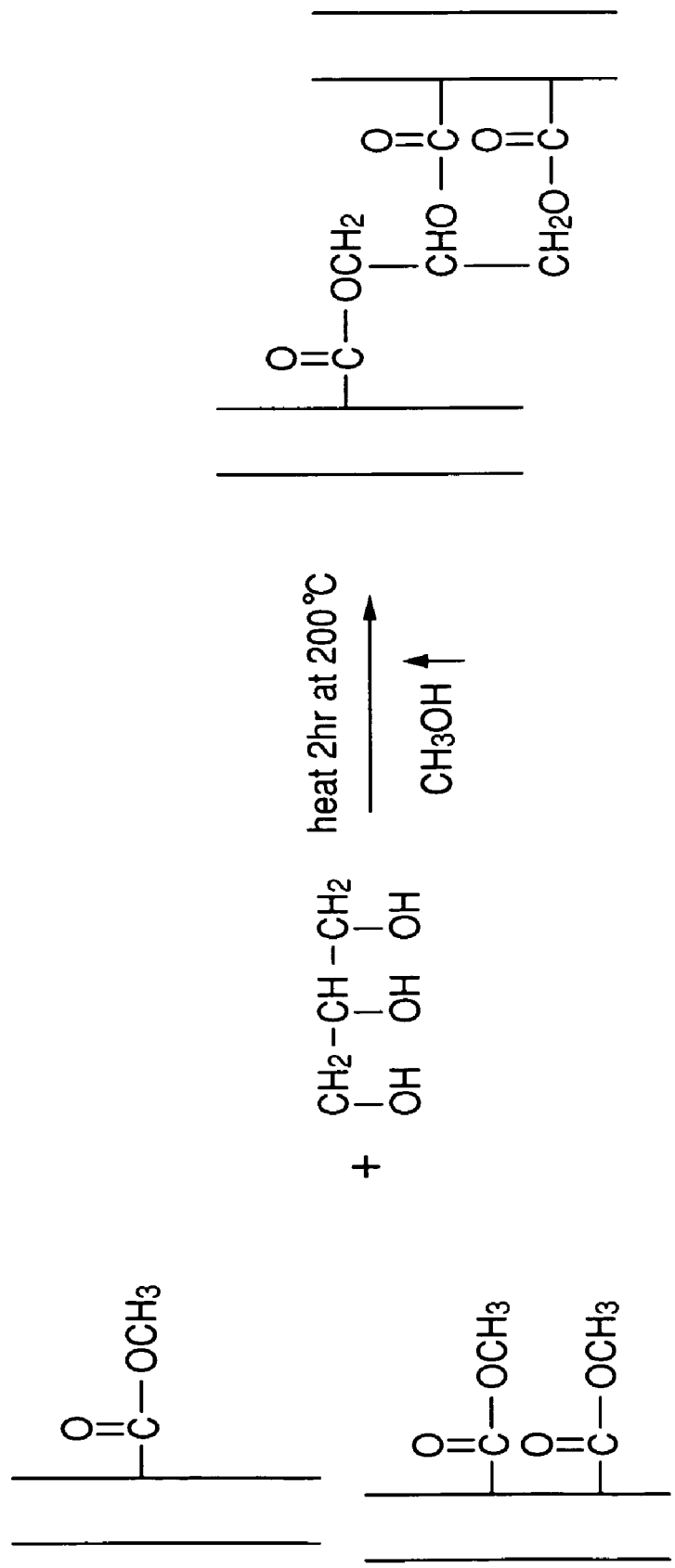
FIG. 9 is a reaction scheme of crosslinking through interesterification in the (crosslinking step) in Example 1.

The tungsten filament that had been thus coated with the crosslinking solution to have a crosslinking film formed thereon was heated at 200° C. for 2 hours so as to cure the film, and a carbon nanotube structure was thus formed. The reaction scheme is in FIG. 9.

The condition of the thus-obtained carbon nanotube structure was confirmed through observation with an optical microscope, and an extremely homogeneous cured film was formed.

In the manner as above, an electron beam generator device having a carbon nanotube structure formed at the tip of the tungsten filament 22, a conductive surface-having base body, was obtained.

(Certification of Test Results)

The electron beam generator device obtained in Example 1 was mounted on a thermal emission-type scanning electron microscope, JSM-T300 (from Nippon Electronics), and driven to emit electron beams, and the absorption current was determined. The accelerating voltage for it was 20 kV and the filament current was 0.3 mA. As a result, the absorption current was about 48 pA. This value is about 2 times the absorption current (about 25 pA) of the ordinary tungsten chip 26 not coated with a carbon nanotube structure, and this confirms the excellent effect of the electron beam generator device of the invention having the carbon nanotube structure as above.

This test certification is for the thermal emission-type device. In the device, however, electrons may be emitted by the carbon nanotube structure, and it is understood that the invention is applicable to all electron-emission type devices. Accordingly, the certified test results may confirm that the electron beam generator device of the invention having the carbon nanotube structure as above is effective in field-emission electron sources.

What is claimed is:

1. An electron beam generator device comprising:
   a base body having a conductive surface; and
   an electron-emission electrode having a carbon nanotube structure on the conductive surface of the base body,
   wherein the carbon nanotube structure constitutes a network structure which has plural carbon nanotubes and a crosslinked part including a chemical bond of plural functional groups, the chemical bond at least connecting one end of one of the carbon nanotubes to another one of the carbon nanotubes.

2. The electron beam generator device according to claim 1, wherein the crosslinked part is formed by curing a solution that contains plural carbon nanotubes each having a functional group, to cause a chemical bonding between the plurality of the functional groups contained in the carbon nanotubes.

3. The electron beam generator device according to claim 1, wherein the crosslinked part is formed by curing a carbon nanotube having a functional group and a crosslinking agent capable of reacting with the functional group, to cause a crosslinking reaction of the functional group contained in the carbon nanotube with the crosslinking agent.

4. The electron beam generator device according to claim 3, wherein the crosslinked part has a chemical structure selected from the group consisting of —COO($CH_2$)$_2$OCO—, —COOCH$_2$CHOHCH$_2$OCO—, —COOCH$_2$CH(OCO—)CH$_2$OH and —COOCH$_2$CH(OCO—)CH$_2$OCO—.

5. The electron beam generator device according to claim 1, wherein the crosslinked part has a structure formed with a chemical bond of the plurality of the functional groups.

6. The electron beam generator device as claimed in claim 5, wherein the crosslinked part has at least one selected from the group consisting of —COOCO—, —O—, —NHCO—, —COO—, —NCH—, —NH—, —S—, —O—, —NHCOO— and —S—S—.

7. The electron beam generator device according to claim 1, wherein the carbon nanotube is a multi-walled carbon nanotube.

8. The electron beam generator device according to claim 1, wherein a material of the conductive surface of the base body is at least one selected from the group consisting of W, Mo, Ta, $LaB_6$, ZrC, TiC, TaC, HfC, GaN, Si, diamond, and diamond-like carbon.

9. The electron beam generator device according to claim 1, further comprising an aliphatic polyketone polymer which is crosslinked with the carbon nanotube structure via the functional group of the carbon nanotube structure to form a network structure complex with the carbon nanotube structure and the aliphatic polyketone polymer.

* * * * *